(12) United States Patent
Ko et al.

(10) Patent No.: US 10,026,681 B2
(45) Date of Patent: Jul. 17, 2018

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Tae Ho Ko, Suwon-si (KR); Dae Hee Lee, Suwon-si (KR); Bong Soo Kim, Suwon-si (KR); Myeong Ho Hong, Suwon-si (KR); Do Young Jeong, Suwon-si (KR); Joon Seok Oh, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/469,709

(22) Filed: Mar. 27, 2017

(65) Prior Publication Data

US 2018/0082933 A1 Mar. 22, 2018

(30) Foreign Application Priority Data

Sep. 21, 2016 (KR) .................. 10-2016-0120974
Nov. 29, 2016 (KR) .................. 10-2016-0160724

(51) Int. Cl.
*H01L 23/52* (2006.01)
*H01L 23/498* (2006.01)
(Continued)

(52) U.S. Cl.
CPC .... *H01L 23/49816* (2013.01); *H01L 23/3171* (2013.01); *H01L 23/49827* (2013.01);
(Continued)

(58) Field of Classification Search
CPC ......... H01L 23/49827; H01L 23/49816; H01L 23/49838; H01L 24/06; H01L 24/14; H01L 23/3171
(Continued)

(56) References Cited

U.S. PATENT DOCUMENTS 7,064,440 B2 * 6/2006 Jobetto ............... H01L 21/4857
257/210
7,183,639 B2 * 2/2007 Mihara .................. H01L 21/56
257/690

(Continued)

OTHER PUBLICATIONS

Taiwan Office Action issued in corresponding Taiwan Patent Application No. 106110931, dated Apr. 25, 2018, with English Translation.

*Primary Examiner* — Luan C Thai
(74) *Attorney, Agent, or Firm* — McDermott Will & Emery LLP

(57) ABSTRACT

A fan-out semiconductor package includes a first connection member having a through-hole, a semiconductor chip disposed in the through-hole, a first encapsulant encapsulating at least portions of the first connection member and the semiconductor chip, a second connection member disposed on the first connection member and the semiconductor chip. The first connection member and the second connection member respectively include redistribution layers electrically connected to the connection pads of the semiconductor chip. The fan-out semiconductor package may have excellent rigidity, may be thinned, and may be manufactured in a simplified process.

36 Claims, 18 Drawing Sheets

(51) Int. Cl.
  *H01L 23/31* (2006.01)
  *H01L 23/00* (2006.01)
(52) U.S. Cl.
  CPC ........ *H01L 23/49838* (2013.01); *H01L 24/06* (2013.01); *H01L 24/14* (2013.01); *H01L 2224/02373* (2013.01); *H01L 2224/0401* (2013.01); *H01L 2224/12105* (2013.01)
(58) Field of Classification Search
  USPC ........................................................ 257/738
  See application file for complete search history.

(56) References Cited

U.S. PATENT DOCUMENTS

| | | | |
|---|---|---|---|
| 8,766,440 B2 * | 7/2014 | Kikuchi | .............. H01L 23/5389 257/659 |
| 9,362,161 B2 | 6/2016 | Chi et al. | |
| 9,607,861 B2 * | 3/2017 | Shiota | ................... H01L 21/304 |
| 2014/0063768 A1 | 3/2014 | Tanaka et al. | |
| 2014/0252641 A1 | 9/2014 | Lim et al. | |
| 2016/0013148 A1 | 1/2016 | Lin et al. | |

* cited by examiner

I-I'

FAN-OUT SEMICONDUCTOR PACKAGE

CROSS-REFERENCE TO RELATED APPLICATION(S)

This application claims benefit of priority to Korean Patent Application Nos. 10-2016-0120974 filed on Sep. 21, 2016 and 10-2016-0160724 filed on Nov. 29, 2016, in the Korean Intellectual Property Office, the disclosures of which are incorporated herein by reference in its entirety.

TECHNICAL FIELD

The present disclosure relates to a semiconductor package, and more particularly, to a fan-out semiconductor package in which connection terminals may extend outwardly of a region in which a semiconductor chip is disposed.

BACKGROUND

A significant recent trend in the development of technology related to semiconductor chips has been to reduce the size of semiconductor chips. Therefore, in the case of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package capable of having excellent rigidity, being thinned, and being manufactured in a simplified process.

According to an aspect of the present disclosure, a fan-out semiconductor package may include: a first connection member having a through-hole; a semiconductor chip disposed in the through-hole of the first connection member and having an active surface having connection pads disposed thereon and an inactive surface opposing the active surface; a first encapsulant encapsulating at least portions of the first connection member and the inactive surface of the semiconductor chip; a second encapsulant disposed on the first encapsulant; and a second connection member disposed on the first connection member and the active surface of the semiconductor chip. The first connection member and the second connection member respectively include redistribution layers electrically connected to the connection pads of the semiconductor chip, the first encapsulant includes an insulating resin, a glass fiber, and an inorganic filler, and the second encapsulant includes an insulating resin and an inorganic filler.

According to another aspect of the present disclosure, a fan-out semiconductor package may include: a first connection member having a through-hole; a semiconductor chip disposed in the through-hole of the first connection member and having an active surface having connection pads disposed thereon and an inactive surface opposing the active surface; a first encapsulant encapsulating at least portions of the first connection member and the inactive surface of the semiconductor chip; a second encapsulant disposed on the first encapsulant; and a second connection member disposed on the first connection member and the active surface of the semiconductor chip. The first connection member and the second connection member respectively include redistribution layers electrically connected to the connection pads of the semiconductor chip, and the first encapsulant has an elastic modulus greater than that of the second encapsulant.

According to another aspect of the present disclosure, a fan-out semiconductor package may include: a first connection member having a through-hole; a semiconductor chip disposed in the through-hole of the first connection member and having an active surface having connection pads disposed thereon and an inactive surface opposing the active surface; an encapsulant encapsulating at least portions of the first connection member and the inactive surface of the semiconductor chip; a second connection member disposed on the first connection member and the active surface of the semiconductor chip; a passivation layer disposed on the second connection member. The first connection member and the second connection member respectively include redistribution layers electrically connected to the connection pads of the semiconductor chip, and the passivation layer includes an insulating resin, a glass fiber, and an inorganic filler.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or omitted for clarity.

Herein, a lower side, a lower portion, a lower surface, and the like, are used to refer to a direction toward a mounted surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
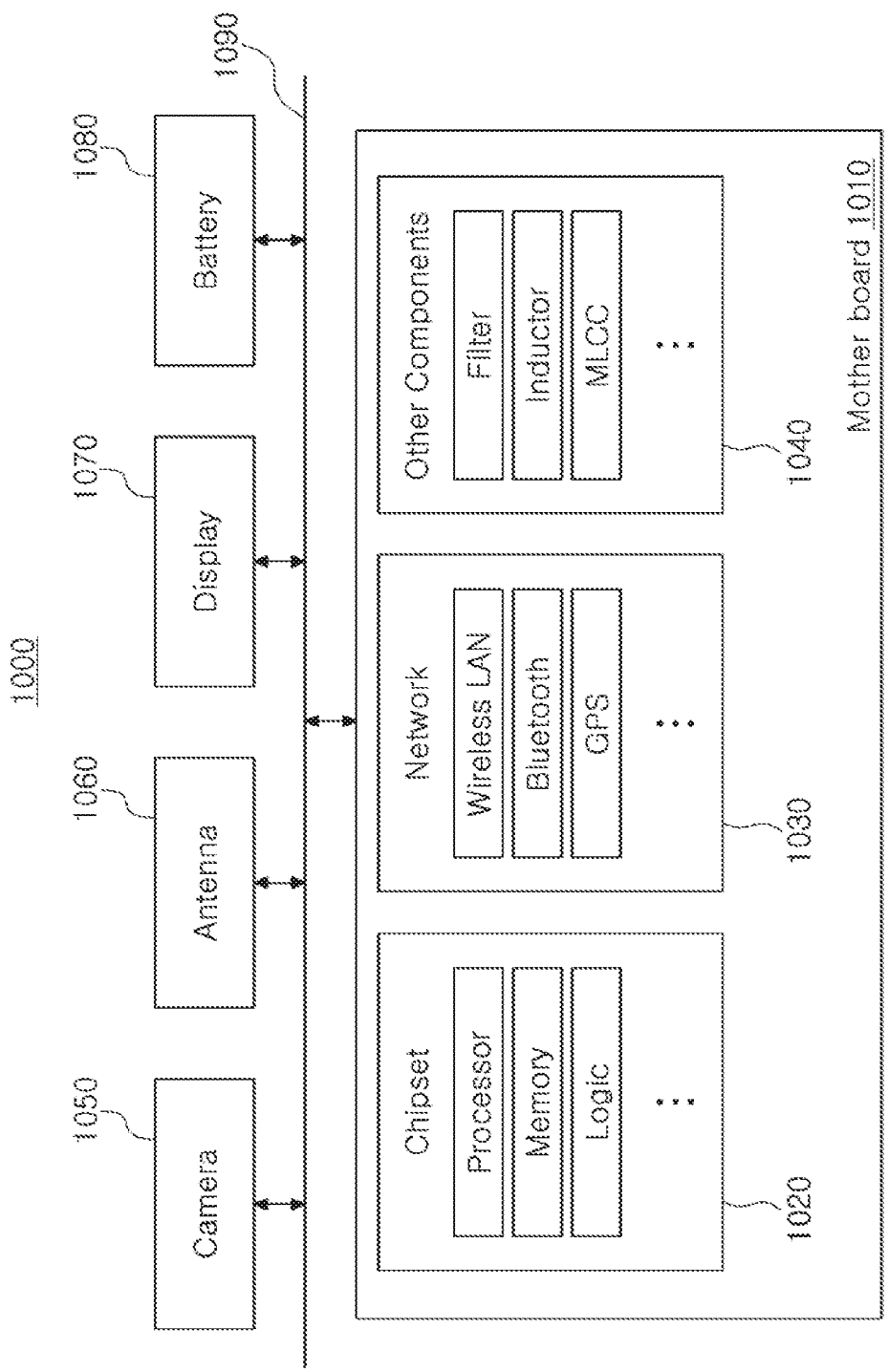
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mother board 1010 therein. The mother board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
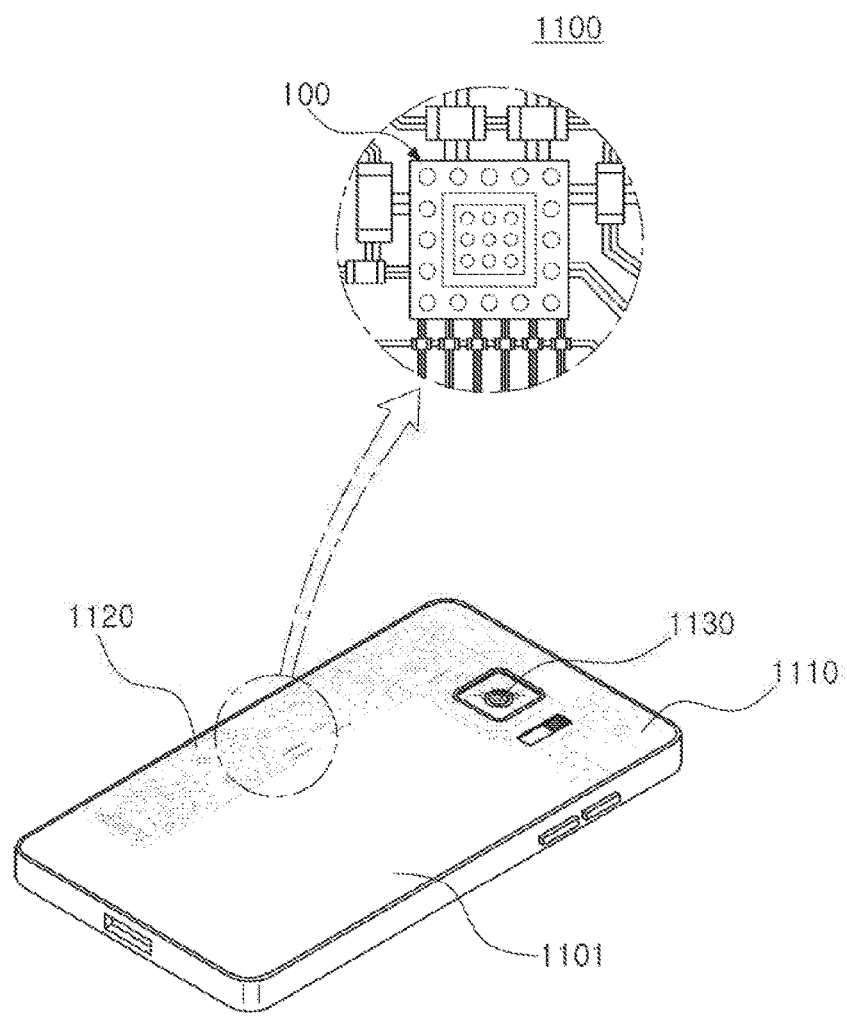
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1050, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and intervals between the connection pads of the semiconductor chip are very fine, while sizes of component mounting pads of the main board used in the electronic device and intervals between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
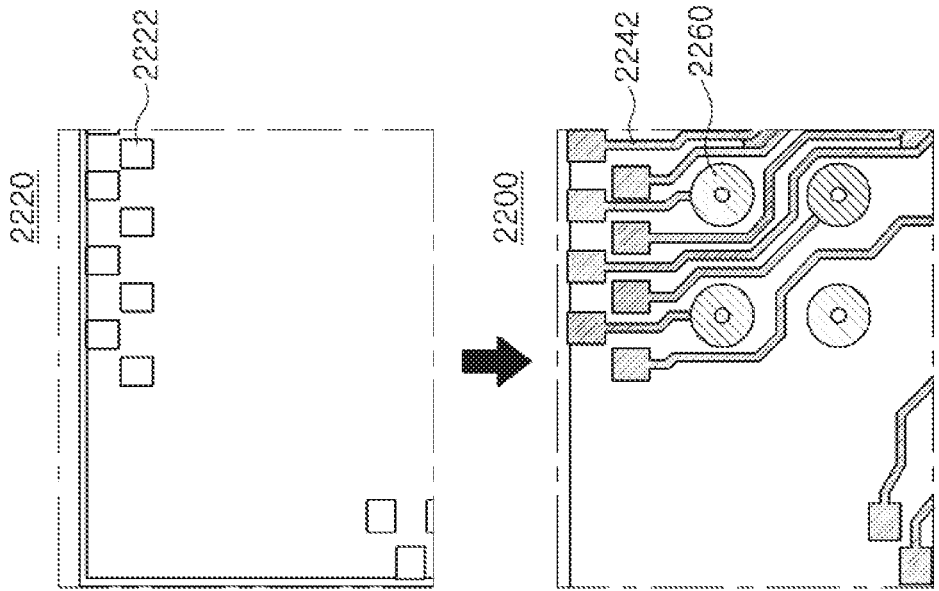
FIGS. 3A and 3B are schematic cross-sectional views illustrating states of a fan-in semiconductor package before and after being packaged.
Figure 3A:
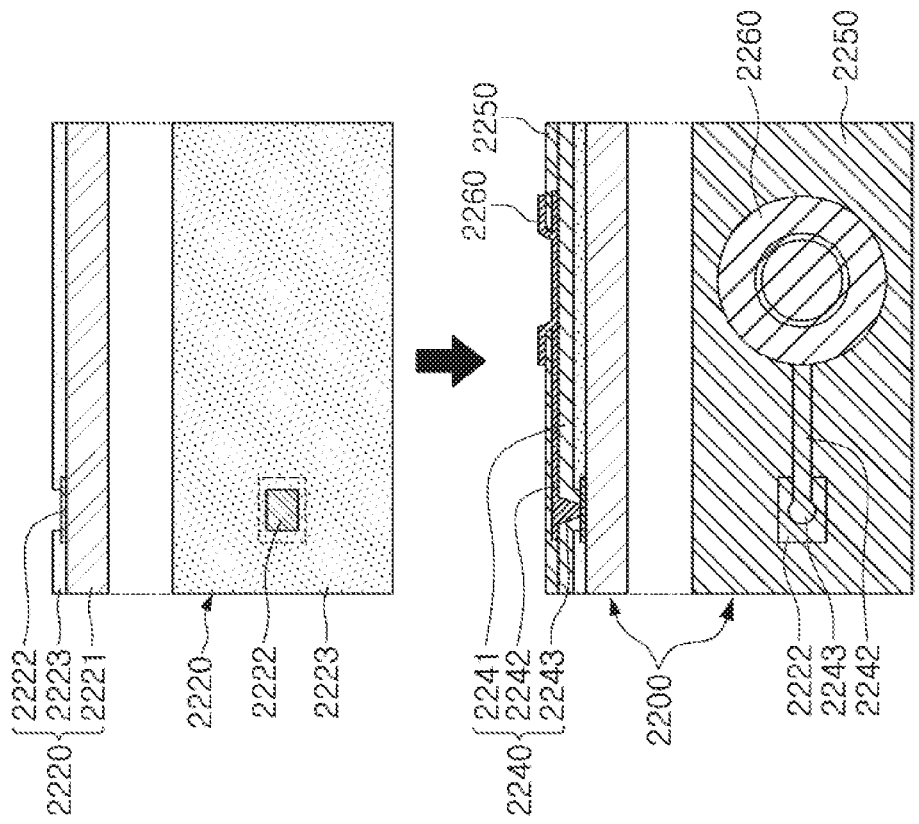

FIGS. 3A and 3B are schematic cross-sectional views illustrating states of a fan-in semiconductor package before and after being packaged.

Figure 4:
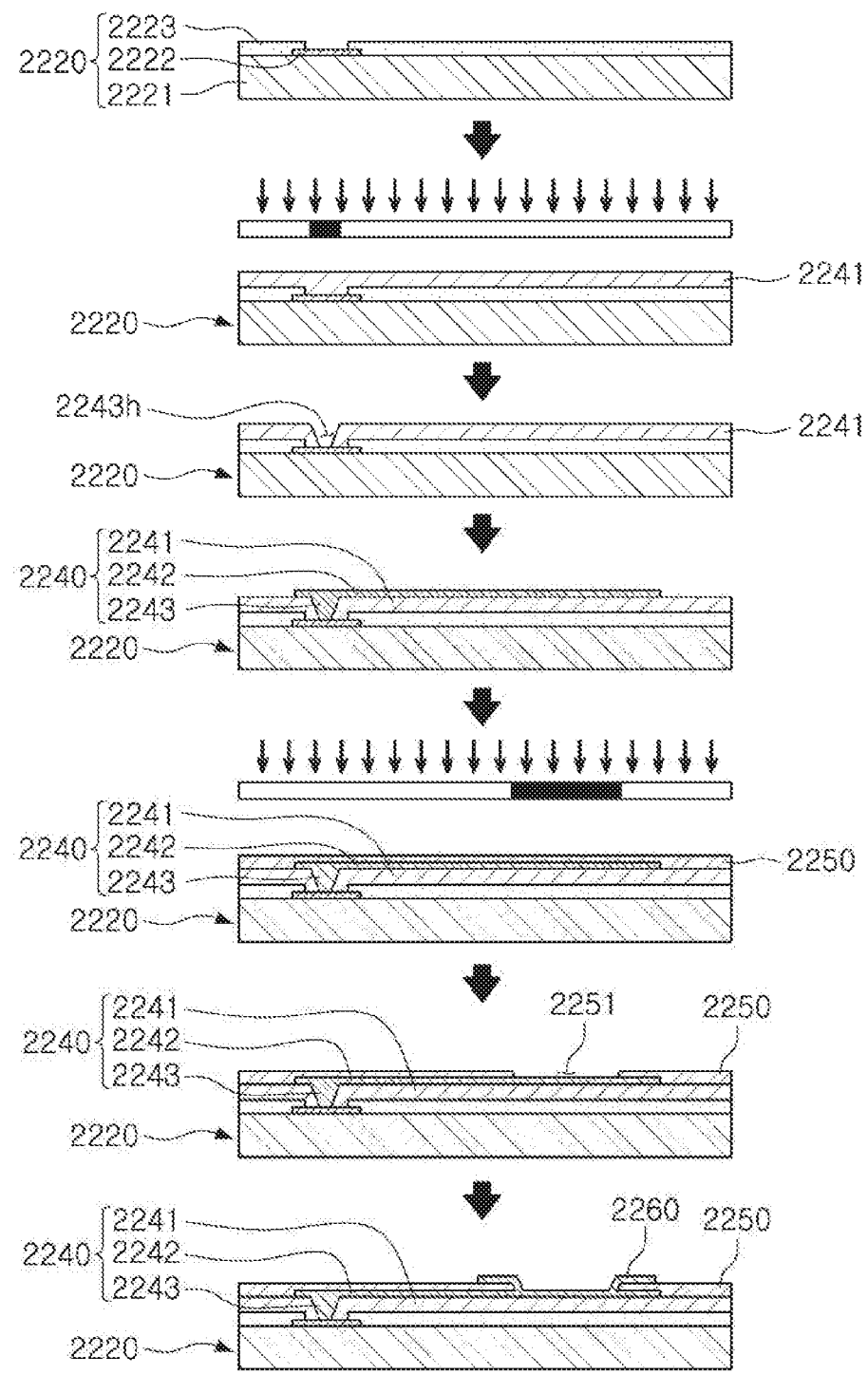
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a connection member 2240 may be formed on the semiconductor chip 2220 depending on a size thereof in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an under-bump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost may have excellent electrical characteristics and may be produced at a low cost. Therefore, many elements mounted in smartphones have been manufactured in fan-in semiconductor package form. In detail, many elements mounted in smartphones have been developed to allow rapid signal transfer to be implemented while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
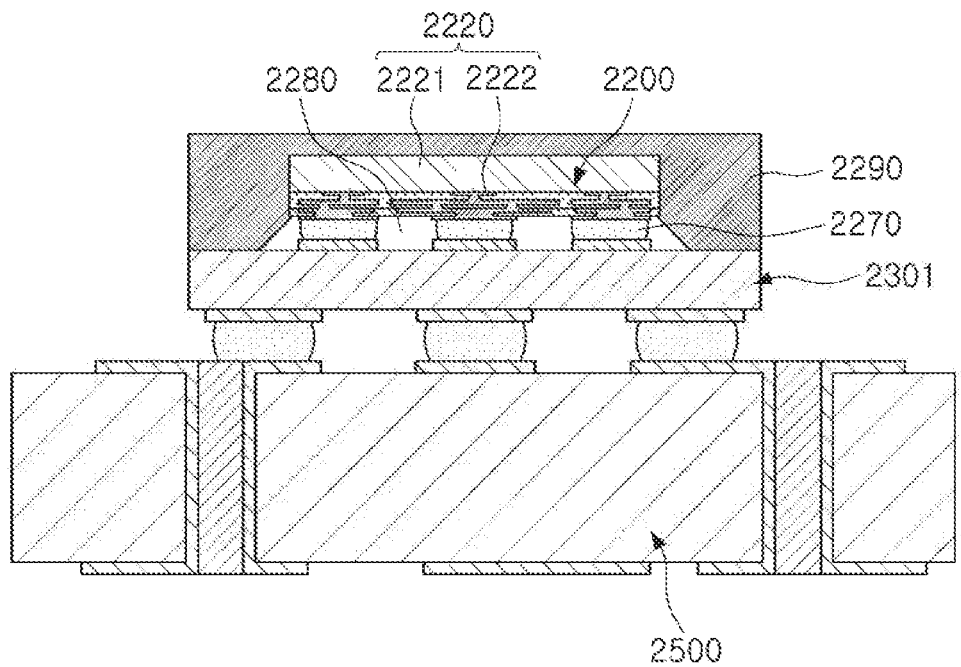
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
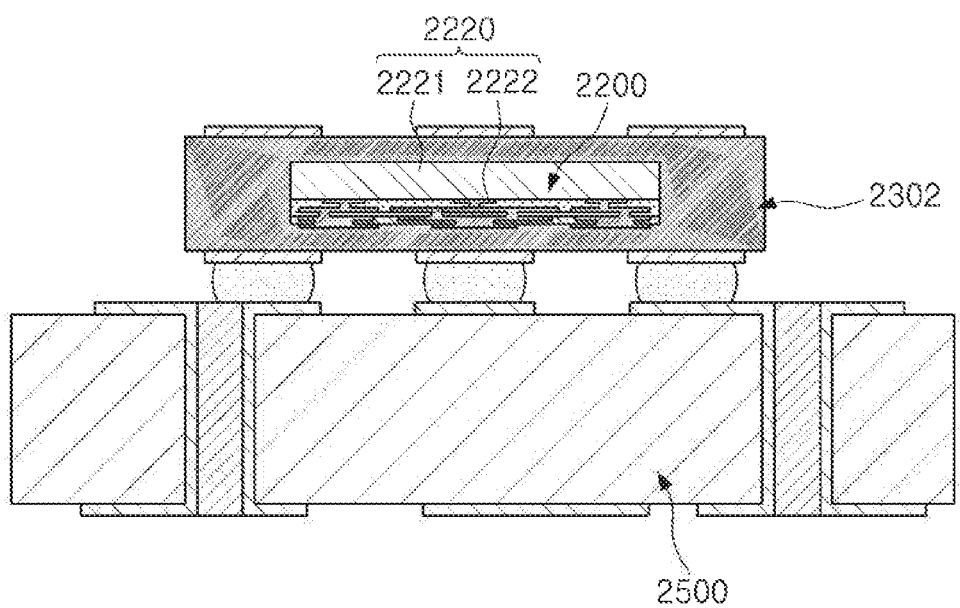
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in state of being mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
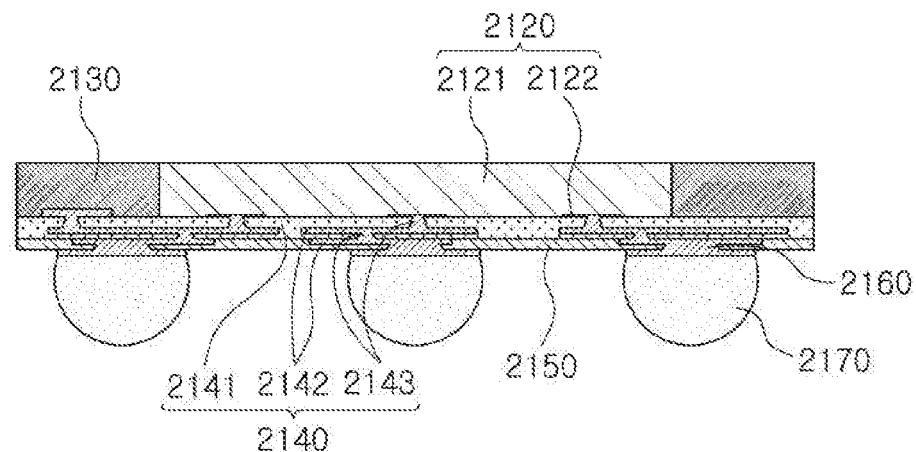
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an under-bump metal layer 2160 may further be formed in openings of the passivation layer 2150. Solder balls 2170 may further be formed on the under-bump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is reduced, a size and a pitch of balls need to be reduced, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case that a size of the semiconductor chip is reduced, a standardized ball layout may be used in the fan-out semiconductor package as is, such that the fan-out semiconductor package may be mounted on the main board of the electronic device without using a separate interposer substrate, as described below.

Figure 8:
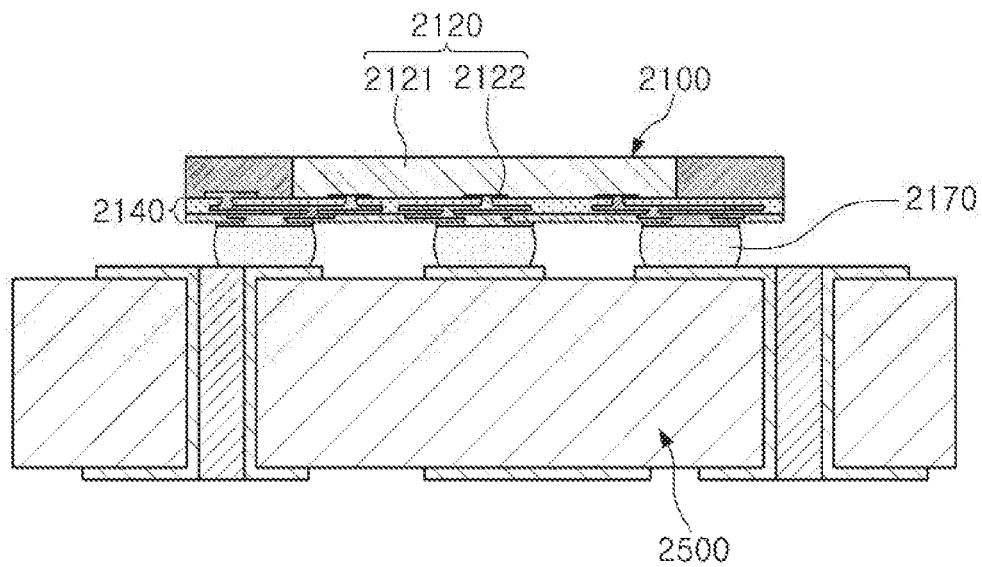
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type semiconductor package using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package capable of having excellent rigidity, being thinned, and being manufactured in a simplified process will hereinafter be described with reference to the drawings.

Figure 9:
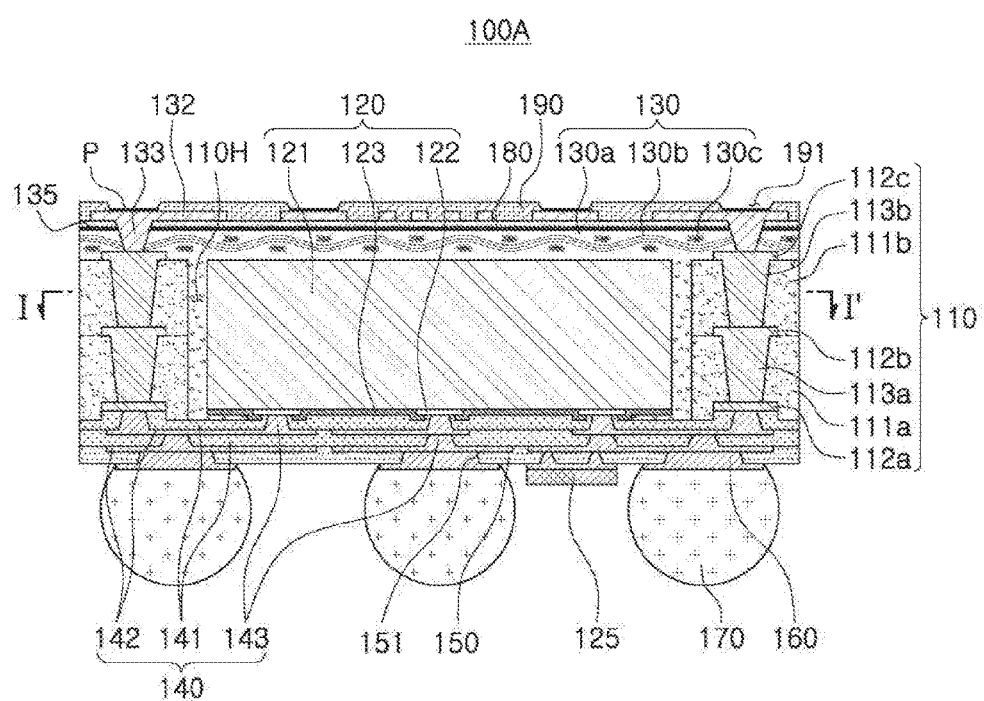
FIG. 9 is a schematic cross-sectional view illustrating an example of a fan-out semiconductor package.

FIG. 9 is a schematic cross-sectional view illustrating an example of a fan-out semiconductor package.

Figure 10:
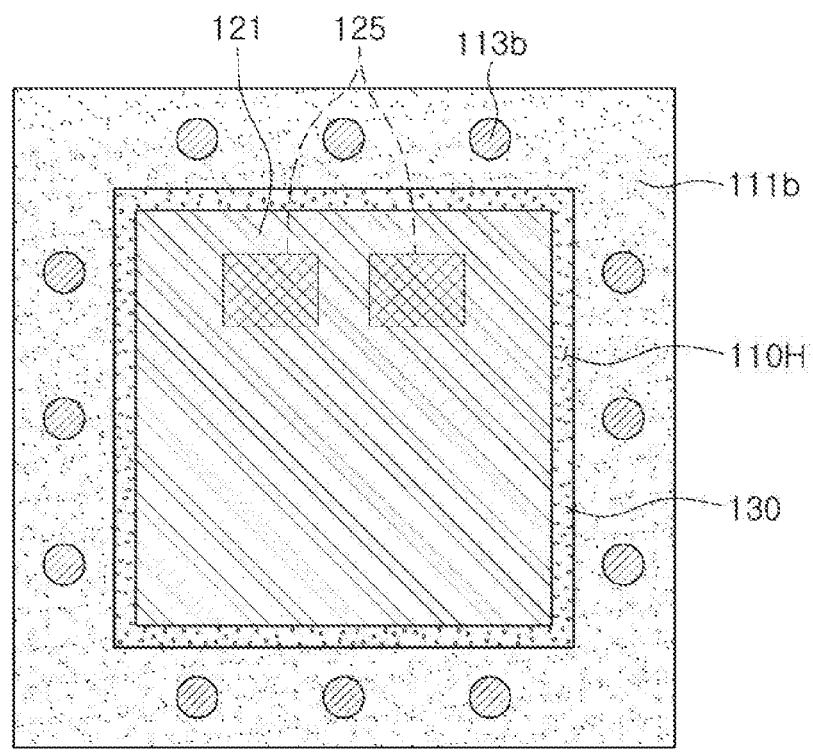
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Referring to the drawings, a fan-out semiconductor package 100A according to an exemplary embodiment in the present disclosure may include a first connection member 110 having a through-hole 110H, a semiconductor chip 120 disposed in the through-hole 110H of the first connection member 110 and having an active surface having connection pads 122 disposed thereon and an inactive surface opposing the active surface, a first encapsulant 130 encapsulating at least portions of the first connection member 110 and the inactive surface of the semiconductor chip 120, a second encapsulant 180 disposed on the first encapsulant 180, and a second connection member 140 disposed on the first connection member 110 and the active surface of the semiconductor chip 120. The first connection member 110 may include redistribution layers 112a, 112b, and 112c electrically connected to the connection pads 122 of the semiconductor chip 120. The second connection member 140 may also include a redistribution layer 142 electrically connected to the connection pads 122 of the semiconductor chip 120. The first encapsulant 130 may include a resin 130a, a core material 130b, and a filler 130c. The second encapsulant 180 may include a resin and a filler, but may not include a core material. The first encapsulant 130 may have an elastic modulus greater than that of the second encapsulant 180.

In general, a reinforcing layer has been used in order to control warpage, or the like, of a semiconductor package generated in a process of manufacturing the semiconductor package. The reinforcing layer may be separately attached to an encapsulant. The reinforcing layer may include a material having excellent rigidity. Therefore, the reinforcing layer may be attached to the encapsulant to maintain rigidity of the semiconductor package. However, since the reinforcing layer is separately manufactured and attached to the encapsulant, the process of manufacturing the semiconductor package is complicated. In addition, there is a limitation in thinning the semiconductor package due to the attachment of the reinforcing layer. In addition, in a case in which the reinforcing layer is attached to the encapsulant, it may be difficult to form openings in an upper portion of the semiconductor package. Therefore, it may be difficult to form marks or apply the semiconductor package to a package-on-package, or the like.

On the other hand, in the fan-out semiconductor package 100A according to the exemplary embodiment, a material including the resin 130a, the core material 130b, and the filler 130c and having excellent rigidity may be used as a material of the first encapsulant 130 to maintain rigidity of the fan-out semiconductor package 100A without using a separate reinforcing layer. That is, the rigidity of the fan-out semiconductor package 100A may be sufficiently maintained without using an additional process, and the fan-out semiconductor package 100A may be thinned. In addition, a cost of a raw material may also be reduced. Particularly, the second encapsulant 180 formed of a material different from that of the first encapsulant 130 may be disposed on the first encapsulant 130. In this case, the second encapsulant 180 may not include the core material and may include only the resin and the filler. Therefore, openings penetrating through the first encapsulant 130 may be easily formed through the second encapsulant 180.

In addition, in the fan-out semiconductor package 100A according to the exemplary embodiment, the first connection member 110 may include the redistribution layers 112a, 112b, and 112c that may redistribute the connection pads 122. Therefore, a degree of freedom in a design may be increased, the number of layers of the second connection member 140 may be significantly reduced, such that thinness of the fan-out semiconductor package 100A may be further promoted, and a decrease in a yield depending on a defect at the time of forming the second connection member 140 after the semiconductor chip 120 is disposed may be improved.

Meanwhile, the fan-out semiconductor package 100A according to the exemplary embodiment may further include a backside redistribution layer 132 disposed on the second encapsulant 132 and backside vias 133 penetrating through the first encapsulant 130 and the second encapsulant 180 and connecting the backside redistribution layer 132 and the redistribution layer 112c of the first connection member 110 to each other. Therefore, the degree of freedom in a design may be further increased, and the thinness of the fan-out semiconductor package 100A may be further promoted. In addition, in some cases, the backside redistribution layer 132 may include a ground pattern having a panel shape. In this case, the ground pattern of the backside redistribution layer 132 may cover the inactive surface of the semiconductor chip 120 to further improve electromagnetic wave blocking and/or heat dissipating effects.

Meanwhile, the fan-out semiconductor package 100A according to the exemplary embodiment may further include a first passivation layer 150 disposed on the second connection member 140 and having first openings 151 exposing at least portions of the redistribution layer 142 of the second connection member 140 and a second passivation layer 190 disposed on the second encapsulant 180 and having second openings 191 exposing at least portions of the backside redistribution layer 132. The first and second passivation layers 150 and 190 may be disposed to thus protect components in the fan-out semiconductor package 100A and suppress warpage of the fan-out semiconductor package 100A. In this case, each of the first passivation layer 150 and the second passivation layer 190 may include a resin and a filler. A weight percent of the filler included in the first passivation layer 150 may be greater than that of the filler included in the second passivation layer 190. Therefore, warpage of the fan-out semiconductor package 100A may be further suppressed and board level reliability of the fan-out semiconductor package 100A may be further improved, through adjustment, or the like, of an entire coefficient of thermal expansion (CTE) of the fan-out semiconductor package 100A.

Meanwhile, the fan-out semiconductor package 100A according to the exemplary embodiment may further include an under-bump metal layer 160 formed in the first openings 151 and connected to the exposed redistribution layer 142 of the second connection member 140 and connection terminals 170 formed on the under-bump metal layer 160 and electrically connected to the exposed redistribution layer 142 of the second connection member 140 through the under-bump metal layer 160. The under-bump metal layer 160 may improve connection reliability of the connection terminals 170 to improve board level reliability of the fan-out semiconductor package 100A. The fan-out semiconductor package 100A may be electrically connected to a main board, or the like, through the connection terminals 170.

Meanwhile, the fan-out semiconductor package 100A according to the exemplary embodiment may further include passive components 125 disposed on the first passivation layer 150 to be spaced apart from the connection terminals 170 by a predetermined distance and be side-by-side with the connection terminals 170. The passive components 125 may be land side capacitors (LSCs), or the like, and may be electrically connected to the connection pads 122 of the semiconductor chip 120 through the redistribution layer 142 of the second connection member 140. Since the passive components 125 are disposed on the first passivation layer 150, the passive components 125 may not influence specially on a thickness of the fan-out semiconductor package 100A, and may not influence on a design, or the like, of the redistribution layer 142.

The respective components included in the fan-out semiconductor package 100A according to the exemplary embodiment will hereinafter be described in more detail.

The first connection member 110 may include the redistribution layers 112a, 112b, and 112c redistributing the connection pads 122 of the semiconductor chip 120 to thus reduce the number of layers of the second connection member 140. If necessary, the first connection member 110 may further improve rigidity of the fan-out semiconductor package 100A depending on materials thereof, and serve to secure uniformity of a thickness of the first encapsulant 130. The fan-out semiconductor package 100A according to the exemplary embodiment may be utilized as a package-on-package (POP) type package by the first connection member 110. The first connection member 110 may have the through-hole 110H. The through-hole 110H may have the semiconductor chip 120 disposed therein to be spaced apart from the first connection member 110 by a predetermined distance. Side surfaces of the semiconductor chip 120 may be surrounded by the first connection member 110. However, such a form is only an example and may be variously modified to have other forms, and the fan-out semiconductor package 100A may perform another function depending on such a form.

The first connection member 110 may include a first insulating layer 111a in contact with the second connection member 140, a first redistribution layer 112a in contact with the second connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. The first and second redistribution layers 112a and 112b and the second and third redistribution layers 112b and 112c may be electrically connected to each other by first and second vias 113a and 113b penetrating through the first and second insulating layers 111a and 111b, respectively.

When the first redistribution layer 112a is embedded in the first insulating layer 111a, a step generated due to a thickness of the first redistribution layer 112a may be significantly reduced, and an insulating distance of the second connection member 140 may thus become constant. That is, a difference between a distance from the redistribution layer 142 of the second connection member 140 to a lower surface of the first insulating layer 111a and a distance from the redistribution layer 142 of the second connection member 140 to the connection pad 122 of the semiconductor chip 120 may be smaller than a thickness of the first redistribution layer 112a. Therefore, a high density wiring design of the second connection member 140 may be easy.

A lower surface of the first redistribution layer 112a of the first connection member 110 may be disposed on a level above a lower surface of the connection pad 122 of the semiconductor chip 120. In addition, a distance between the redistribution layer 142 of the second connection member 140 and the first redistribution layer 112a of the first connection member 110 may be greater than that between the redistribution layer 142 of the second connection member 140 and the connection pad 122 of the semiconductor chip 120. Here, the first redistribution layer 112a may be recessed into the first insulating layer 111a. As described above, in a case in which the first redistribution layer 112a is recessed in the first insulating layer 111a, such that the lower surface of the first insulating layer 111a and the lower surface of the first redistribution layer 112a have a step therebetween, a phenomenon in which a material of the first encapsulant 130 bleeds to pollute the first redistribution layer 112a may be prevented. The second redistribution layer 112b of the first connection member 110 may be disposed on a level between the active surface and the inactive surface of the semiconductor chip 120. The first connection member 110 may be formed at have a thickness corresponding to that of the semiconductor chip 120. Therefore, the second redistribution layer 112b formed in the first connection member 110 may be disposed on a level between the active surface and the inactive surface of the semiconductor chip 120.

Thicknesses of the redistribution layers 112a, 112b, and 112c of the first connection member 110 may be greater than that of the redistribution layer 142 of the second connection member 140. Since the first connection member 110 may have a thickness equal to or greater than that of the semiconductor chip 120, the redistribution layers 112a, 112b, and 112c may be formed at large sizes depending on a scale of the first connection member 110. On the other hand, the redistribution layer 142 of the second connection member 140 may be formed to be relatively small for thinness.

A material of each of the insulating layers 111a and 111b is not particularly limited. For example, an insulating material may be used as the material of each of the insulating layer 111a and 111b. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a photoimagable dielectric (PID) resin may also be used as the insulating material.

The redistribution layers 112a, 112b, and 112c may serve to redistribute connection pads 122 of the semiconductor chip 120. A material of each of the redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may have various functions, depending on designs of layers corresponding thereto. For example, the redistribution layers 112a, 112b, and 112c may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a, 112b, and 112c may include a via pad, a wire pad, a connection terminal pad, and the like.

The vias 113a and 113b may electrically connect the redistribution layers 112a, 112b, and 112c formed on different layers to each other, resulting in an electrical pathway in the first connection member 110. A material of each of the vias 113a and 113b may be a conductive material. Each of the vias 113a and 113b may be entirely filled with the conductive material, or the conductive material may also be formed along a wall of respective via holes. In addition, each of the vias 113a and 113b may have all shapes known in the related art, such as a tapered shape, a cylindrical shape, and the like.

When holes for the first vias 113a are formed, some of the pads of the first redistribution layer 112a may serve as a stopper, and it may thus be advantageous in a process that each of the first vias 113a has the tapered shape of which a width of an upper surface is greater than that of a lower surface. In this case, the first vias 113a may be integrated with the pad patterns of the second redistribution layer 112b. In addition, when holes for the second vias 113b are formed, some of the pads of the second redistribution layer 112b may serve as a stopper, and it may thus be advantageous in a process that each of the second vias 113b has the tapered shape of which a width of an upper surface is greater than that of a lower surface. In this case, the second vias 113b may be integrated with the pad patterns of the third redistribution layer 112c.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the above-mentioned elements may also be combined with each other and be disposed.

The semiconductor chip 120 may be an IC formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. The lower surface of the connection pad 122 may have a step with respect to a lower surface of the first encapsulant 130 through the passivation layer 123. Resultantly, a phenomenon that the first encapsulant 130 bleeds into the lower surface of the connection pad 122 may be prevented to some degree. An insulating layer (not illustrated), and the like, may also be further disposed in other required positions.

The passive components 125 may be various kinds of passive components. For example, the passive component 125 may be a multilayer ceramic capacitor (MLCC), a low inductance chip capacitor (LICC), a land side capacitor (LSC), an inductor, an integrated passive device (IPD), or the like. The LSC may be used as the passive component 125 for thinness. The LSC may be may be electrically connected to a power (P) pattern of the redistribution layer 142 of the second connection member 140, but is not limited thereto. A plurality of passive components 125 may be disposed. In this case, the plurality of passive components 125 may be the same as or different from each other. The passive components 125 may be attached to the first passivation layer 150 using a solder, or the like, to be disposed to be spaced apart from the connection terminals 170 by a predetermined distance and be side-by-side with the connection terminals 170.

The first encapsulant 130 may protect the first connection member 110, the semiconductor chip 120, and the like. An encapsulation form of the first encapsulant 130 is not particularly limited, but may be a form in which the first encapsulant 130 surrounds at least portions of the first connection member 110, the semiconductor chip 120, and the like. For example, the first encapsulant 130 may cover the first connection member 110 and the inactive surface of the semiconductor chip 120, and fill spaces between walls of the through-hole 110H and the side surfaces of the semiconductor chip 120. In addition, the first encapsulant 130 may also fill at least a portion of a space between the passivation layer 123 of the semiconductor chip 120 and the second connection member 140. The first encapsulant 130 may fill the through-hole 110H to thus serve as an adhesive and reduce buckling of the first semiconductor chip 120 depending on materials thereof.

The first encapsulant 130 may include the resin 130a, the core material 130b, and the filler 130c. The resin 130a may be an insulating resin, more specifically, a thermosetting resin such as an epoxy resin or a thermoplastic resin such as a polyimide resin, or the like, the core material 130b may be a glass fiber (or a glass cloth or a glass fabric), or the like, and the filler 130c may be an inorganic filler such as silica, alumina, or the like. However, the resin 130a, the core material 130b, and the filler 130c are not limited thereto. For example, the first encapsulant 130 may be formed of prepreg, an unclad copper clad laminate (CCL), a GC material to be described below, but is not limited thereto. Since the first encapsulant 130 includes the core material 130b, the rigidity of the fan-out semiconductor package 100A may be maintained. In addition, since the first encapsulant 130 includes the filler 130c, a coefficient of thermal expansion (CTE) of the fan-out semiconductor package may be adjusted, such that generation of warpage due to mismatch between CTEs may be suppressed.

A material of the first encapsulant 130 may encapsulate the first connection member 110 and the semiconductor chip 120 in a non-hardened state. Therefore, the resin 130a and the filler 130c may be disposed in the spaces between the walls of the through-hole 110H and the side surfaces of the semiconductor chip 120 as well as on the first connection member 110 and the inactive surface of the semiconductor chip 120. On the other hand, the core material 130b may be disposed on only the first connection member 110 and the inactive surface of the semiconductor chip 120. Meanwhile, the core material 130b may be disposed in an upper portion of the fan-out semiconductor package 100A to maintain the rigidity of the fan-out semiconductor package 100A in the upper portion of the fan-out semiconductor package 100A.

The second encapsulant 180 may include the resin and the filler. The second encapsulant 180 may not include the core material. The resin may be an insulating resin, more specifically, a thermosetting resin such as an epoxy resin or a thermoplastic resin such as a polyimide resin, or the like, and the filler may be an inorganic filler such as silica, alumina, or the like. However, the resin and the filler are not limited thereto. For example, the second encapsulant 180 may be formed of ABF, or the like, but is not limited thereto. As described above, the second encapsulant 180 may be introduced, such that the openings may be easily formed in the first encapsulant 130 in which it is difficult to form the openings in itself. In addition, entire warpage of the fan-out semiconductor package 100A may be more effectively controlled due to a symmetry effect between the second encapsulant 180 and the first passivation layer 150. If necessary, the first encapsulant 130 may be formed of a GCP material to be described below. At this point, a primer layer 135 in contact with the second encapsulant 180 may be disposed on at least a portion of a surface of the first encapsulant 130 in contact with the second encapsulant 180. The primer layer 135 may be a metal thin film including copper (Cu), or the like, but is not limited thereto. A surface of the primer layer 135 may be rough due to a desmear process, or the like, such that reliability of connection between the primer layer 135 and the second encapsulant 180 may be excellent.

The first encapsulant 130 may have the elastic modulus greater than that of the second encapsulant 180. That is, the first encapsulant 130 may include the core material 130a, such that the first encapsulant 130 may have rigidity more excellent than that of the second encapsulant 180. The rigidity of the fan-out semiconductor package 100A may be maintained by the first encapsulant 130 having the relatively large elastic modulus as described above, and a limitation of the material of the first encapsulant 130 may be supplemented with the second encapsulant 180 having the relatively small elastic modulus. The elastic modulus refers to a ratio between stress and deformation, and may be measured through a standard tension test specified in, for example, JIS C-6481, KS M 3001, KS M 527-3, ASTM D882, and the like.

The backside redistribution layer 132 may serve to redistribute the connection pads 122, and may cover an upper portion of the semiconductor chip 120 to serve to block electromagnetic waves and/or dissipate heat, if necessary. A material of the backside redistribution layer 132 may be a conductive material such as copper (Cu), aluminum (Al), silver (Ag), tin (Sn), gold (Au), nickel (Ni), lead (Pb), titanium (Ti), or alloys thereof. The backside redistribution layer 132 may perform various functions depending on a design of its corresponding layer. For example, the backside redistribution layer 132 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the backside redistribution layer 132 may include a via pad, a connection terminal pad, and the like.

The backside vias 133 may connect the backside redistribution layer 132 and the third redistribution layer 112c of the first connection member 110 to each other. Therefore, an electrical pathway may be formed in an upper portion of the fan-out semiconductor package 100A. A material of each of the backside vias 133 may be a conductive material such as copper (Cu), aluminum (Al), silver (Ag), tin (Sn), gold (Au), nickel (Ni), lead (Pb), titanium (Ti), or alloys thereof. Each of the backside vias 133 may be entirely filled with a conductive material, or the conductive material may be formed along a wall of each of the vias. In addition, each of the backside vias 133 may have all shapes known in the related art.

The second connection member 140 may redistribute the connection pads 122 of the semiconductor chip 120. Several ten to several hundred connection pads 122 of the semiconductor chip 120 having various functions may be redistributed by the second connection member 140, and may be physically or electrically connected to an external source through the connection terminals 170 depending on the functions. The second connection member 140 may include insulating layers 141, the redistribution layers 142 disposed on the insulating layers 141, and vias 143 penetrating through the insulating layers 141 and connecting the redistribution layers 142 to each other. The second connection member 140 may include a single layer, or may include a plurality of layers depending on a design.

An insulating material may be used as a material of the insulating layers 141. In this case, a photosensitive insulating material such as a photoimagable dielectric (PID) resin may also be used as the insulating material. That is, the insulating layer 141 may be a photosensitive insulating layer. In a case in which the insulating layer 141 has photosensitive properties, the insulating layer 141 may be formed to have a smaller thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other or may be different from each other, as necessary. When the insulating layers 141 are the multiple layers, the insulating layers 141 may be integrated with each other depending on a process, such that a boundary therebetween may not be readily apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may have various functions, depending on designs of layers corresponding thereto. For example, the redistribution layer 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142 may include a via pad, a connection terminal pad, and the like.

The vias 143 may electrically connect the redistribution layers 142, the connection pads 122, or the like, formed on different layers to each other, resulting in an electrical pathway in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be entirely filled with the conductive material, or the conductive material may also be formed along a wall of each of the vias. In addition, each of the vias 143 may have all shapes known in the related art, such as a tapered shape, a cylindrical shape, and the like.

The first passivation layer 150 may protect the second connection member 140 from external physical or chemical damage. The first passivation layer 150 may have the openings 151 exposing at least portions of the redistribution layer 142 of the second connection member 140. The number of openings 151 formed in the first passivation layer 150 may be several tens to several thousands. The first passivation layer 150 may include a resin and a filler, but may not include a core material. That is, the first passivation layer 150 may be, for example, ABF including the insulating resin and the inorganic resin as described above. In this case, the entire warpage of the fan-out semiconductor package 100A may be more easily controlled due to the symmetry effect between the second encapsulant 180 and the first passivation layer 150.

The under-bump metal layer 160 may be additionally configured to improve connection reliability of the connection terminals 170 and improve board level reliability of the fan-out semiconductor package 100A. The under-bump metal layer 160 may be connected to the redistribution layer 142 of the second connection member 140 exposed through the openings 151 of the first passivation layer 150. The under-bump metal layer 160 may be formed in the openings 151 of the first passivation layer 150 by a known metallization method using a known conductive metal such as a metal, but is not limited thereto.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122, or may be provided in an amount of several tens to several thousands or more or several tens to several thousands or less. When the connection terminals 170 are solder balls, the connection terminals 170 may cover side surfaces of the under-bump metal layer 160 extending onto one surface of the first passivation layer 150, and connection reliability may be more excellent.

At least one of the connection terminals 170 may be disposed in a fan-out region. The fan-out region is a region except for the region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a reduced thickness, and may have price competitiveness.

The second passivation layer 190 may protect the backside redistribution layer 132, or the like, from external physical or chemical damage. The second passivation layer 190 may be formed of a photosensitive material including a filler and a resin, for example, a solder resist, but is not limited thereto. The second passivation layer 190 may have openings 191 exposing at least portions of the backside redistribution layer 132. A surface treatment layer P may be formed on a surface of the backside redistribution layer 132 exposed through the openings 191. The surface treatment layer P may be formed of, for example, Ni/Au, Ni/Pd/Au, or the like, but is not limited thereto. Meanwhile, a weight percent of the filler, more specifically, the inorganic filler, included in the first passivation layer 150 may be greater than that of the filler, more specifically, the inorganic filler, included in the second passivation layer 190. Therefore, the warpage of the fan-out semiconductor package 100A may be more effectively controlled through the adjustment, or the like, of the CTE of the fan-out semiconductor package 100A.

Meanwhile, although not illustrated in the drawings, a metal thin film may be formed on a wall of the through-hole 110H, if necessary, in order to dissipate heat or block electromagnetic waves. In addition, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary. In addition, a separate surface mounting technology (SMT) component may be mounted on a surface of the first passivation layer 150, if necessary.

FIGS. 11A through 11F are schematic views illustrating an example of processes of manufacturing the fan-out semiconductor package of FIG. 9.

Figure 11A:
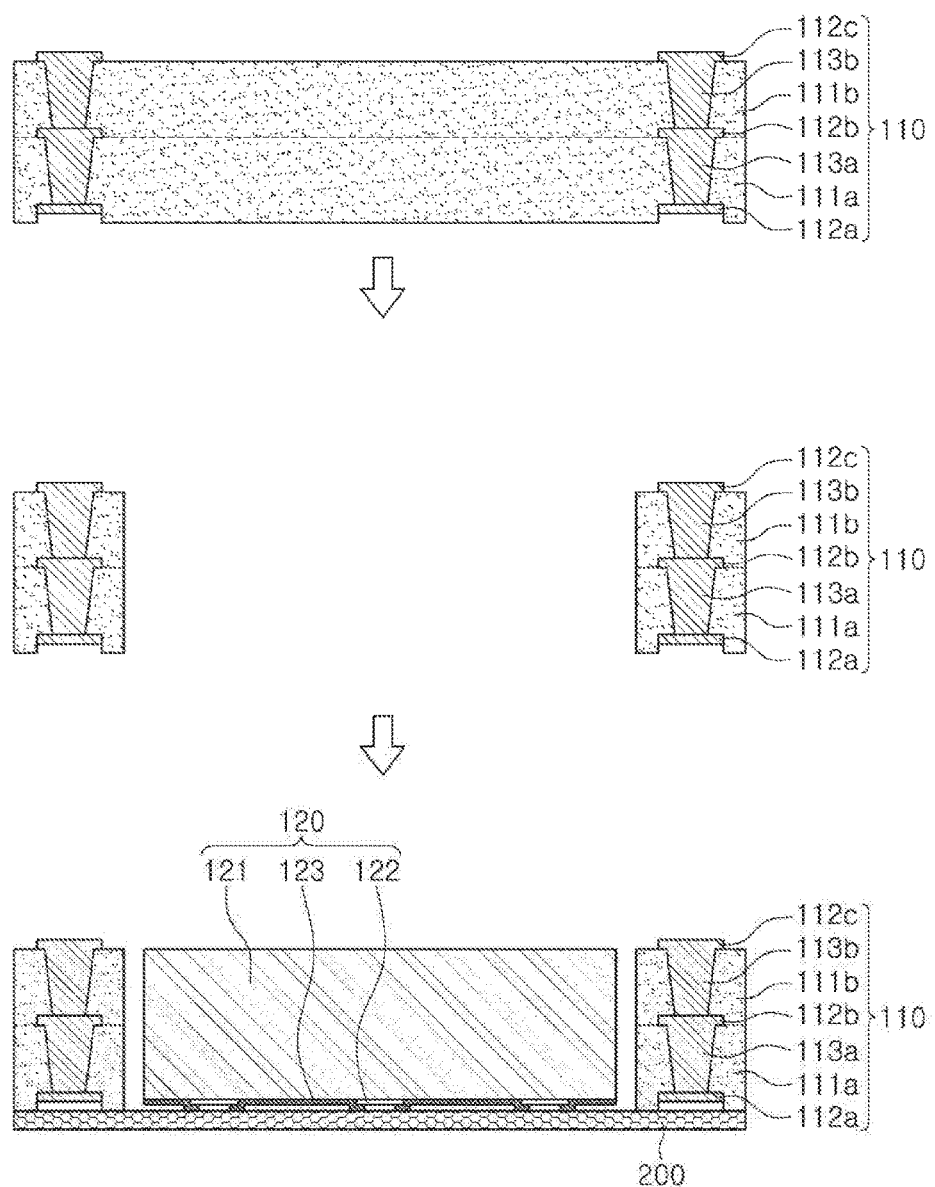
FIGS. 11A through 11F are schematic views illustrating an example of processes of manufacturing the fan-out semiconductor package of FIG. 9.

Referring to FIG. 11A, the first connection member 110 may be prepared. The first connection member 110 may be formed by forming the first redistribution layer 112a on a carrier film having metal layers formed on opposite surfaces, sequentially forming the first insulating layer 111a, the second redistribution layer 112b and the first vias 113a, the second insulating layer 111b, and the third redistribution layer 112c and the second vias 113b, separating the first redistribution layer 112a, the first insulating layer 111a, the second redistribution layer 112b and the first vias 113a, the second insulating layer 111b, and the third redistribution layer 112c and the second vias 113b from the carrier film, and etching the metal layer remaining on the first redistribution layer 112a. Then, the through-hole 110H penetrating through the first connection member 110 may be formed. The through-hole 110H may be formed using a mechanical drill or a laser drill. However, the through-hole 110H is not limited thereto, and may also be formed by a sand blast method using particles for polishing, a dry etching method using plasma, or the like. In a case in which the through-hole 110H is formed using the mechanical drill or the laser drill, a resin smear in the through-hole 110H may be removed by performing a desmear process such as a permanganate method, or the like. Then, an adhesive film 200 may be attached on a lower surface of the first connection member 110. Any material that may fix the first connection member 110 may be used as the adhesive film 200. As a non-restrictive example, a known tape, or the like, may be used. An example of a known tape may include a thermosetting adhesive tape of which adhesion is weakened by heat treatment, an ultraviolet-curable adhesive tape of which adhesion is weakened by ultraviolet ray irradiation, or the like. Then, the semiconductor chip 120 may be disposed in the through-hole 110H of the first connection member 110. For example, the semiconductor chip 120 may be disposed by a method of attaching the semiconductor chip 120 to the adhesive film 200 in the through-hole 110H. The semiconductor chip 120 may be disposed in a face-down form so that the connection pads 122 are attached onto the adhesive film 200.

Figure 11B:
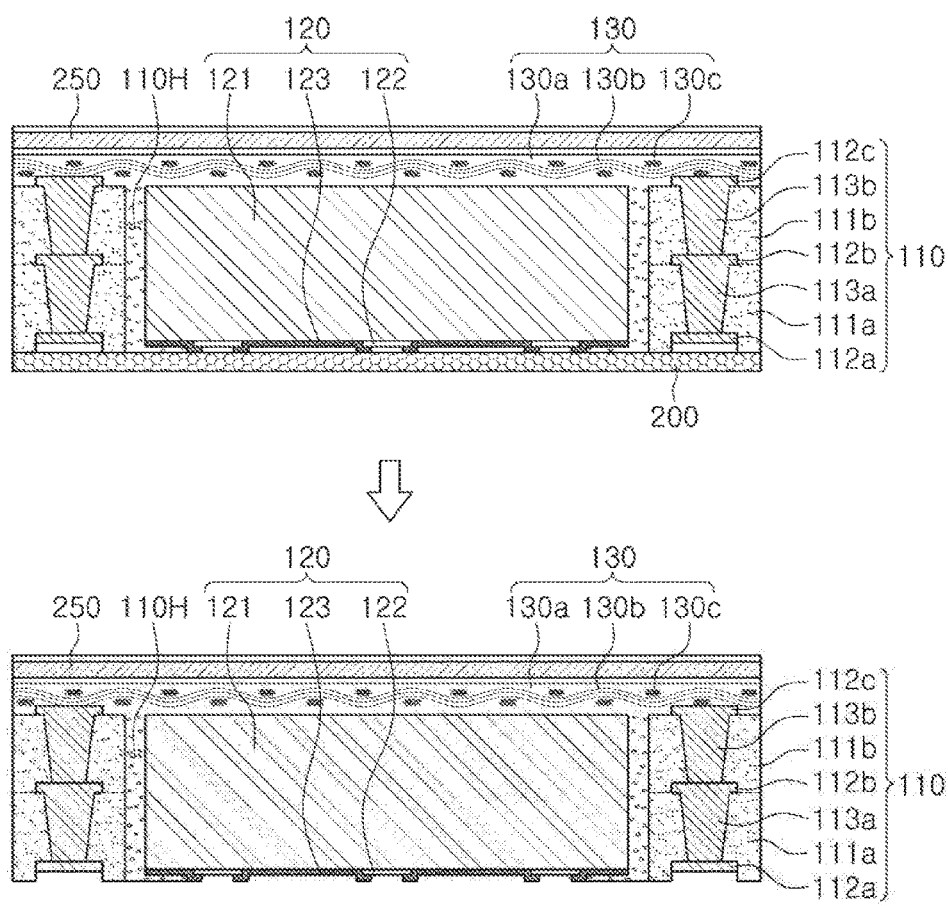

Referring to FIG. 11B, the semiconductor chip 120 may be encapsulated using the first encapsulant 130. The first encapsulant 130 may cover the first connection member 110 and the inactive surface of the semiconductor chip 120, and may fill a space within the through-hole 110H. The first encapsulant 130 may be formed by laminating a material including the resin 130a, the core material 130b, and the filler 130c and being in a non-hardened state on the adhesive film 200 and then hardening the material. A GC material to be described below may be used as the material of the first encapsulant 130. After the semiconductor chip 120 is encapsulated with the first encapsulant 130, a carrier film 250 may be attached to the first encapsulant 130. A case in which a non-completed package structure is disposed in a lower portion and the carrier film 250 is disposed in an upper portion is illustrated in the drawing. However, actually, the non-completed package structure may be attached to the carrier film 250 in a state in which the case illustrated in the drawing rotates by 180 degrees. The carrier film 250 may be, for example, a copper clad laminate (CCL), or the like, having metal layers formed on opposite surfaces of a core layer formed of prepreg, or the like, but is not limited thereto. Then, the adhesive film 200 may be stripped. A method of stripping the adhesive film 200 is not particularly limited. For example, in a case in which the thermosetting adhesive tape of which adhesion is weakened by heat treatment, the ultraviolet-curable adhesive tape of which adhesion is weakened by ultraviolet ray irradiation, or the like, is used as the adhesive film 200, the adhesive film 200 may be stripped after the adhesion of the adhesive film 200 is weakened by heat-treating the adhesive film 200 or may be stripped after the adhesion of the adhesive film 200 is weakened by irradiating the adhesive film 200 with an ultraviolet ray.

Figure 11C:
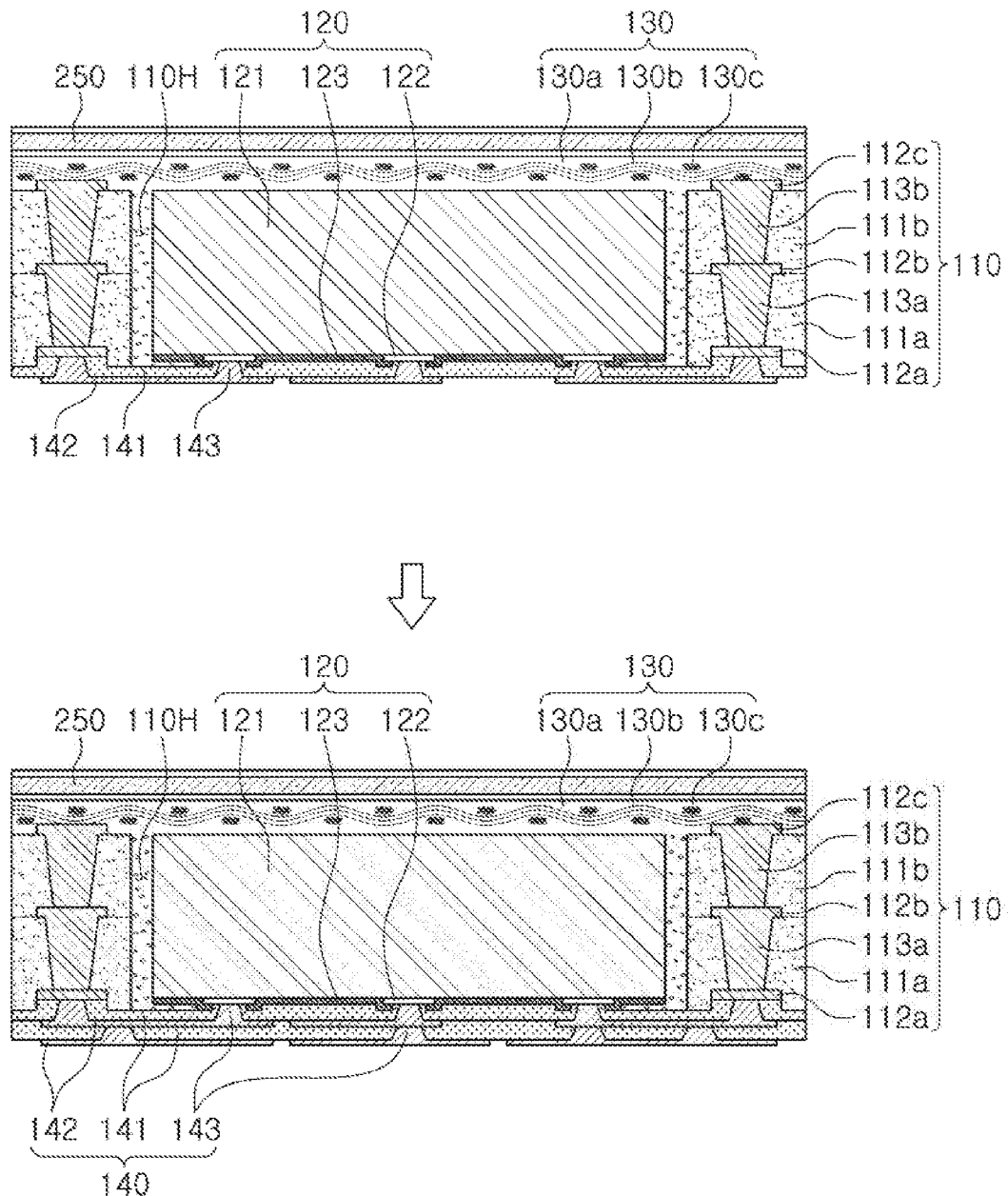

Referring to FIG. 11C, the second connection member 140 may be formed on the first connection member 110 and the active surface of the semiconductor chip 120 from which the adhesive film 200 is removed. The second connection member 140 may be formed by forming the insulating layer 141 by a lamination method, an applying method, or the like, and forming the redistribution layer 142 and the vias 143 on and in the insulating layer 141 using a patterning process, a plating process, and the like, using a dry film, or the like. Holes penetrating through the insulating layer 141 for forming the vias 143 may be formed by photolithography, or the like. The redistribution layer 142 and the vias 143 may be formed by forming a Ti/Cu seed layer by sputtering, forming a Cu plating layer by electroplating, or the like, and then etching the Ti/Cu seed layer except patterns. The processes described above may be repeated to form the second connection member 140 including a plurality of layers.

Figure 11D:
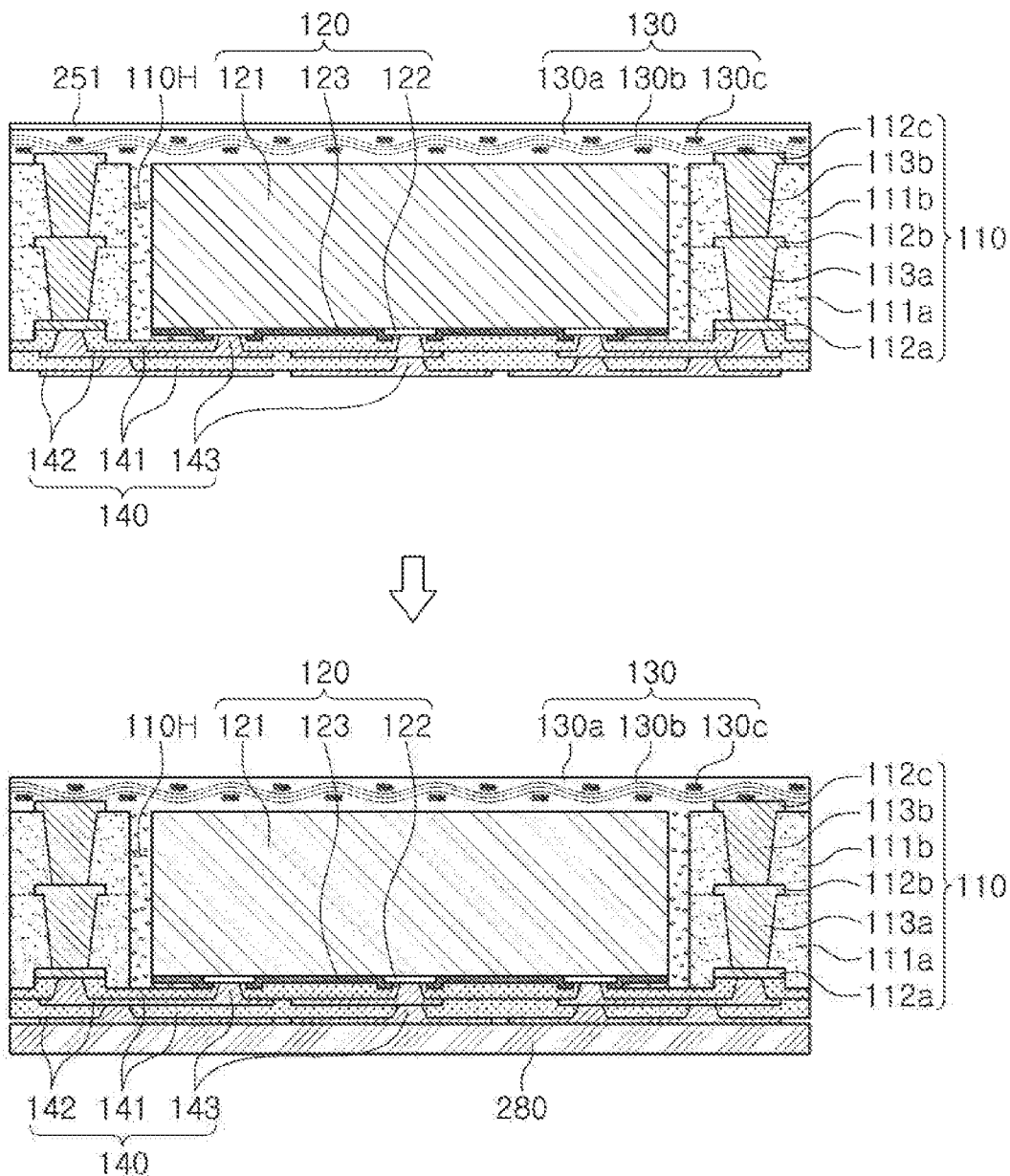

Referring to FIG. 11D, the carrier film 250 may be stripped. A method of stripping the carrier film 250 is not particularly limited. After the carrier film 250 is stripped, a metal layer 251 of the carrier film 250 may remain on the first encapsulant 130. Then, a dry film 280 may be attached to the second connection member 140, and the metal layer 251 remaining on the first encapsulant 130 may be removed by etching. Meanwhile, the dry film 280 may protect the redistribution layer 142, and the like, of the second connection member 140 in a process of etching the metal layer 251. If necessary, the metal layer 251 may be used as the primer layer 135 as mentioned above. At this point, a surface of the primer layer 135 may be rough due to a desmear process, or the like, such that reliability of connection between the primer layer 135 and the second encapsulant 180 may be excellent.

Figure 11E:
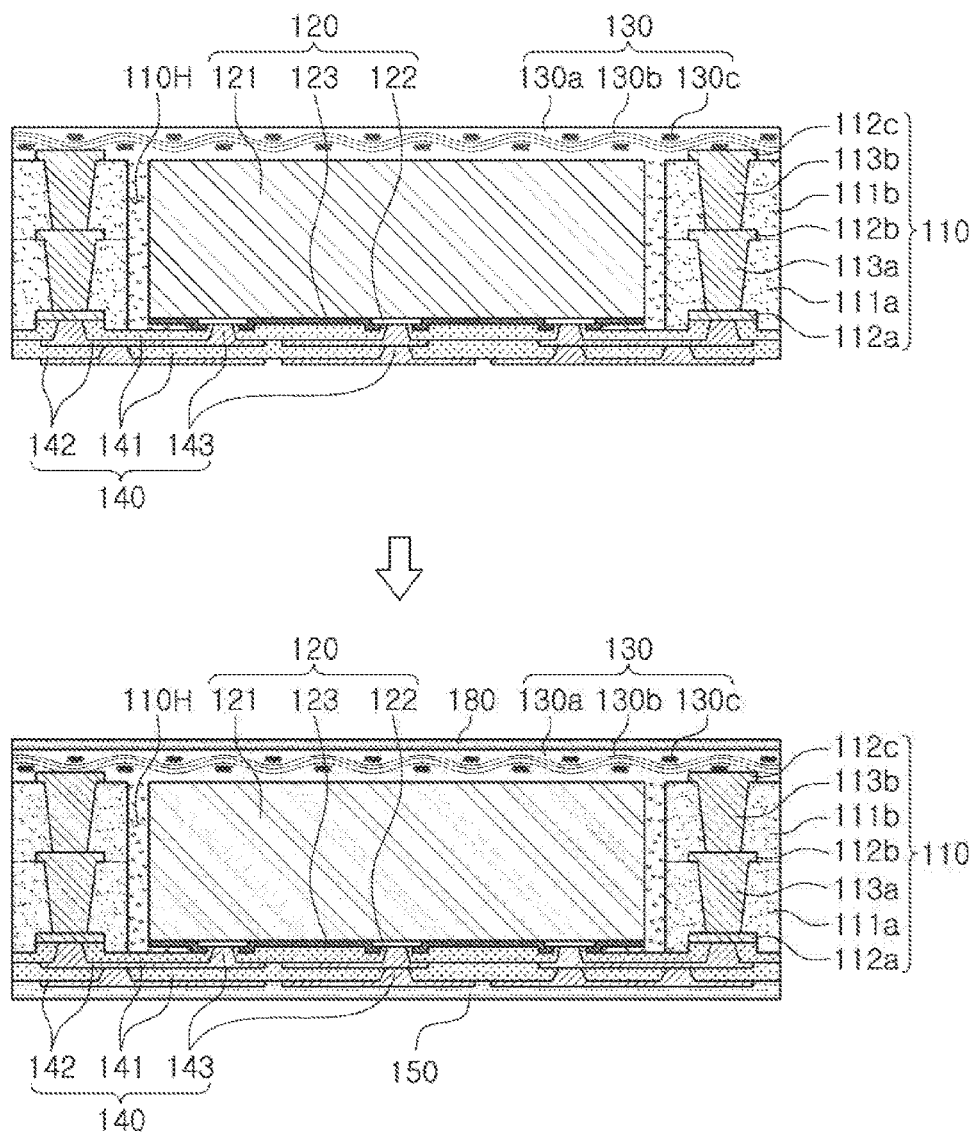

Referring to FIG. 11E, the dry film 280 may be stripped. Then, the first passivation layer 150 may be formed on the second connection member 140. In addition, the second encapsulant 180 may be formed on the first encapsulant 130. Each of the first passivation layer 150 and the second encapsulant 180 may be formed by laminating a material including a resin and a filler, for example, ABF and then hardening the material. Layers formed of the same material or similar materials may be introduced into upper and lower portions of the fan-out semiconductor package 100A to effectively control warpage of the fan-out semiconductor package 100A.

Figure 11F:
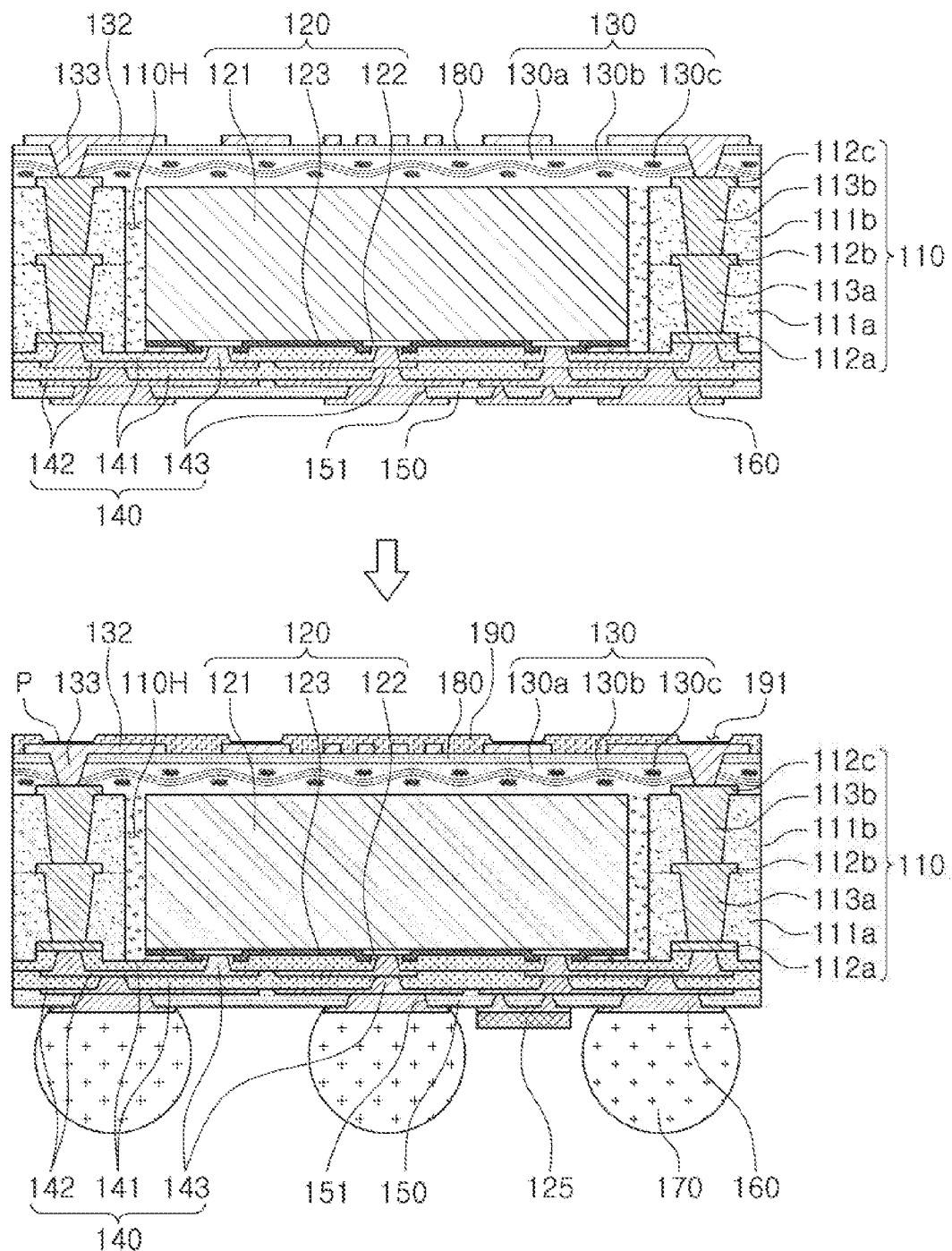

Referring to FIG. 11F, the openings 151 may be formed in the first passivation layer 150, and the under-bump metal layer 160 may be formed in the openings 151. In addition, holes penetrating through the first encapsulant 130 and the second encapsulant 180 may be formed, and the backside redistribution layer 132 and the backside vias 133 may be formed. In more detail, the under-bump metal layer 160 may be formed by forming the openings 151 in the first passivation layer 150 through a via process and a desmear process and then performing a known plating and patterning method, for example, processes of seed layer forming, dry film patterning, pattern filling plating, dry film stripping, seed layer etching, and the like. The backside redistribution layer 132 and the backside vias 133 may also be formed by forming the openings 151 penetrating through the first encapsulant 130 and the second encapsulant 180 through a via process and a desmear process and then performing a known plating and patterning method, for example, processes of seed layer forming, dry film patterning, pattern filling plating, dry film stripping, seed layer etching, and the like. Then, the second passivation layer 190 having the openings 191 exposing at least portions of the backside redistribution layer 132 may be formed on the second encapsulant 180. The second passivation layer 190 may be formed by, for example, a method of applying and hardening a solder resist, or the like, and the openings 191 may be formed by photolithography, or the like. The surface treatment layer P may be formed on a surface of the exposed backside redistribution layer 132. The surface treatment layer P may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like, but is not limited thereto. In addition, the connection terminals 170 and the passive components 125 may be formed, if necessary. The connection terminals 170 may be fixed by reflow, and portions of the connection terminals 170 may be embedded in the first passivation layer 150 in order to enhance fixing force, and the remaining portions of the connection terminals 170 may be externally exposed, such that reliability may be improved. The passive components 125 may be attached using surface mounting technology (SMT). In this case, soldering, solder balls having a micro size, or the like, may be used.

Meanwhile, a series of processes may be processes of preparing the first connection member 110 having a large size, manufacturing a plurality of fan-out semiconductor packages 100A using the first connection member 110 having the large size, and then singulating the plurality of fan-out semiconductor packages into individual fan-out semiconductor packages 100A through a sawing process in order to facilitate mass production. In this case, productivity may be excellent.

Figure 12:
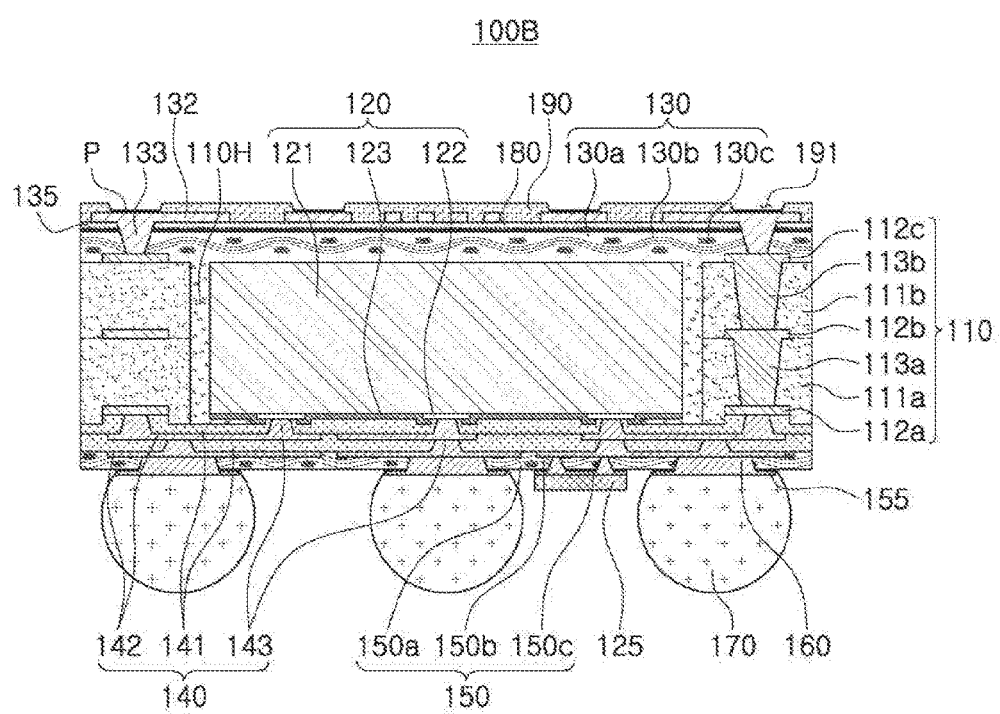
FIG. 12 is a schematic cross-sectional view illustrating another example of a fan-out semiconductor package.

FIG. 12 is a schematic cross-sectional view illustrating another example of a fan-out semiconductor package.

Referring to the drawing, in a fan-out semiconductor package 100B according to another exemplary embodiment in the present disclosure, a first passivation layer 150 as well as a first encapsulant 130 may include a resin 150a, a core material 150b, and a filler 150c. The resin 150a may be an insulating resin, for example, a thermosetting resin such as an epoxy resin or a thermoplastic resin such as a polyimide resin, or the like, the core material 150b may be a glass fiber (or a glass cloth or a glass fabric), or the like, and the filler 150c may be an inorganic filler such as silica, alumina, or the like. However, the resin 150a, the core material 150b, and the filler 150c are not limited thereto. Since the first passivation layer 150 includes the core material 150b as described above, the first encapsulant 130 having excellent rigidity may be disposed in an upper portion of the fan-out semiconductor package 100B, and the first passivation layer 150 having excellent rigidity may be disposed in a lower portion of the fan-out semiconductor package 100B, such that warpage dispersion may be suppressed. In addition, since the first passivation layer 150 includes the filler 150c, a CTE of the fan-out semiconductor package may be adjusted, such that generation of warpage due to mismatch between CTEs may be suppressed.

Meanwhile, if necessary, a primer layer 135 in contact with the second encapsulant 180 may be disposed on at least a portion of a surface of the first encapsulant 130 in contact with the second encapsulant 180. The primer layer 135 may be a metal thin film including copper (Cu), or the like, but is not limited thereto. A surface of the primer layer 135 may be rough due to a desmear process, or the like, such that reliability of connection between the primer layer 135 and the second encapsulant 180 may be excellent. Also, a primer layer 155 in contact with an under-bump metal layer 160 may be disposed on at least portions of a surface of the first passivation layer 150 on which a circuit needs to be formed, that is, a surface of the first passivation layer 150 on which the under-bump metal layer 160 is formed. The primer layer 155 may be a metal thin film including copper (Cu), or the like, but is not limited thereto. The primer layer 155 may be utilized as a basic seed layer when the under-bump metal layer 160 is formed. A surface of the primer layer 155 may be rough due to a desmear process, or the like, such that reliability of connection between the primer layer 155 and the under-bump metal layer 160 may be excellent.

A description, or the like, of configurations other than the abovementioned configurations and a method for manufacturing the fan-out semiconductor package 100B overlaps that described above, and is thus omitted.

Figure 13:
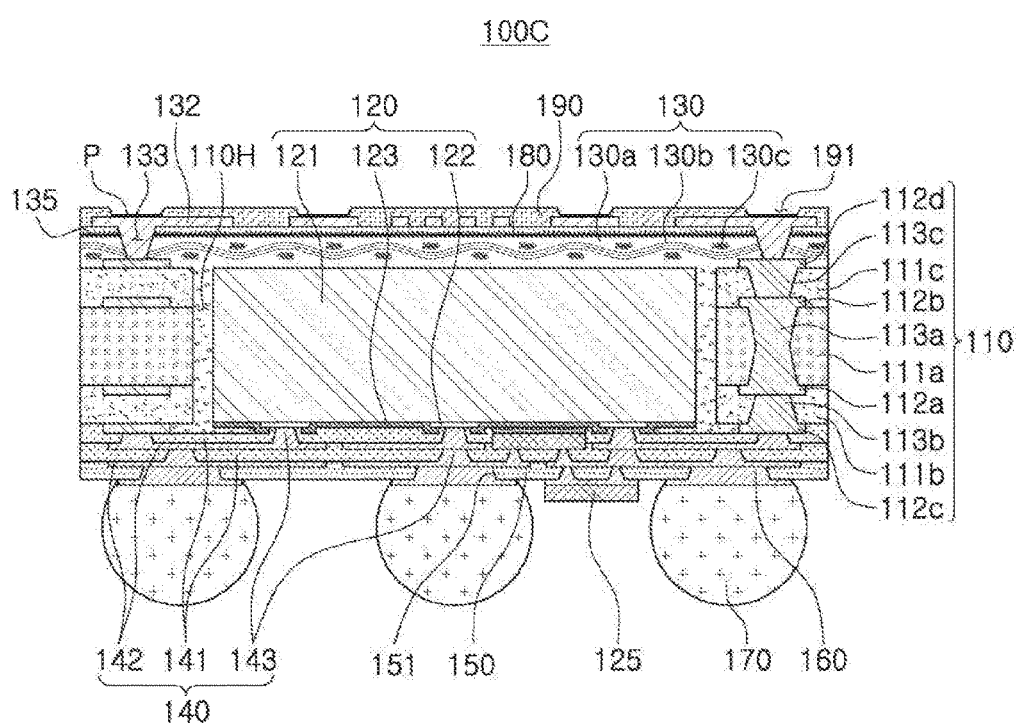
FIG. 13 is a schematic cross-sectional view illustrating another example of a fan-out semiconductor package.

FIG. 13 is a schematic cross-sectional view illustrating another example of a fan-out semiconductor package.

Referring to the drawing, in a fan-out semiconductor package 100C according to another exemplary embodiment in the present disclosure, a first connection member 110 may include a first insulating layer 111a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first connection member 110 may include a larger number of redistribution layers 112a, 112b, 112c, and 112d, a second connection member 140 may be further simplified. Therefore, a decrease in a yield depending on a defect occurring in a process of forming the second connection member 140 may be improved. Meanwhile, the first to fourth redistribution layers 112a, 112b, 112c, and 112d may be electrically connected to each other by first to third vias 113a, 113b, and 113c respectively penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, since the first vias 113a penetrate through the first insulating layer 111a, the first vias 113a may have a diameter greater than those of second vias 113b and third vias 113c respectively penetrating through the second insulating layer 111b and the third insulating layer 111c.

A lower surface of the third redistribution layer 112c of the first connection member 110 may be disposed on a level below a lower surface of the connection pad 122 of a semiconductor chip 120. In addition, a distance between a redistribution layer 142 of the second connection member 140 and the third redistribution layer 112c of the first connection member 110 may be smaller than that between the redistribution layer 142 of the second connection member 140 and the connection pad 122 of the semiconductor chip 120. Here, the third redistribution layer 112c may be disposed in a protruding form on the second insulating layer 111b, resulting in contacting the second connection member 140. The first redistribution layer 112a and the second redistribution layer 112b of the first connection member 110 may be disposed on a level between an active surface and an inactive surface of the semiconductor chip 120. The first connection member 110 may be formed at have a thickness corresponding to that of the semiconductor chip 120. Therefore, the first redistribution layer 112a and the second redistribution layer 112b formed in the first connection member 110 may be disposed on a level between the active surface and the inactive surface of the semiconductor chip 120.

Thicknesses of the redistribution layers 112a, 112b, 112c, and 112d of the first connection member 110 may be greater than that of the redistribution layer 142 of the second connection member 140. Since the first connection member 110 may have a thickness equal to or greater than that of the semiconductor chip 120, the redistribution layers 112a, 112b, 112c, and 112d may also be formed to have large sizes. On the other hand, the redistribution layer 142 of the second connection member 140 may be formed to be relatively small for thinness.

A description, or the like, of configurations other than the abovementioned configurations and a method for manufacturing the fan-out semiconductor package 100C overlaps that described above, and is thus omitted. Meanwhile, as in the fan-out semiconductor package 100B according to another exemplary embodiment, a first passivation layer 150 of the fan-out semiconductor package 100C according to another exemplary embodiment may be formed of a material having excellent rigidity.

Figure 14:
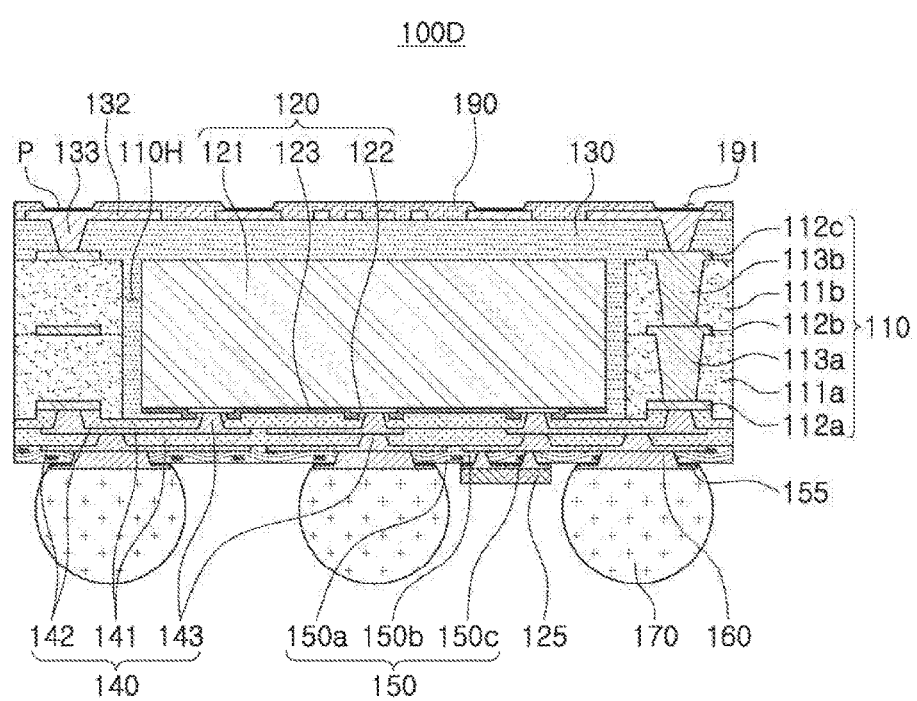
FIG. 14 is a schematic cross-sectional view illustrating another example of a fan-out semiconductor package.

FIG. 14 is a schematic cross-sectional view illustrating another example of a fan-out semiconductor package.

Referring to the drawing, in a fan-out semiconductor package 100D according to another exemplary embodiment in the present disclosure, a first passivation layer 150 rather than a first encapsulant 130 may include a resin 150a, a core material 150b, and a filler 150c. The resin 150a may be an insulating resin, for example, a thermosetting resin such as an epoxy resin or a thermoplastic resin such as a polyimide resin, or the like, the core material 150b may be a glass fiber (or a glass cloth or a glass fabric), or the like, and the filler 150c may be an inorganic filler such as silica, alumina, or the like. However, the resin 150a, the core material 150b, and the filler 150c are not limited thereto. Also in a case in which only the first passivation layer 150 includes the core material 150b as described above, the first passivation layer 150 having excellent rigidity may be disposed in a lower portion of the fan-out semiconductor package 100D, such that generation of warpage of the fan-out semiconductor package 100 may be suppressed. The first encapsulant 130 may be formed of, for example, ABF including a resin and a filler, but is not limited thereto. In a case in which the AFB, or the like, is used as a material of the first encapsulant 130, a second encapsulant 180 may be omitted. In this case, a backside redistribution layer 132 may be formed on the first encapsulant 130, and backside vias 133 may penetrate through the first encapsulant 130.

Meanwhile, if necessary, a primer layer 155 in contact with an under-bump metal layer 160 may be disposed on at least portions of a surface of the first passivation layer 150 on which a circuit needs to be formed, that is, a surface of the first passivation layer 150 on which the under-bump metal layer 160 is formed. The primer layer 155 may be a metal thin film including copper (Cu), or the like, but is not limited thereto. The primer layer 155 may be utilized as a basic seed layer when the under-bump metal layer 160 is formed. A surface of the primer layer 155 may be rough due to a desmear process, or the like, such that reliability of connection between the primer layer 155 and the under-bump metal layer 160 may be excellent.

A description, or the like, of configurations other than the abovementioned configurations and a method for manufacturing the fan-out semiconductor package 100D overlaps that described above, and is thus omitted.

Figure 15A:
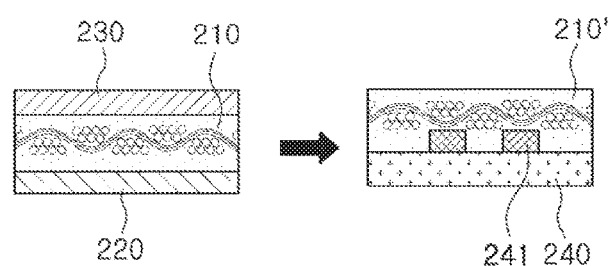
FIGS. 15A and 15B are schematic views illustrating examples of materials that may be used as materials of an encapsulant and/or a passivation layer of a fan-out semiconductor package.
Figure 15B:
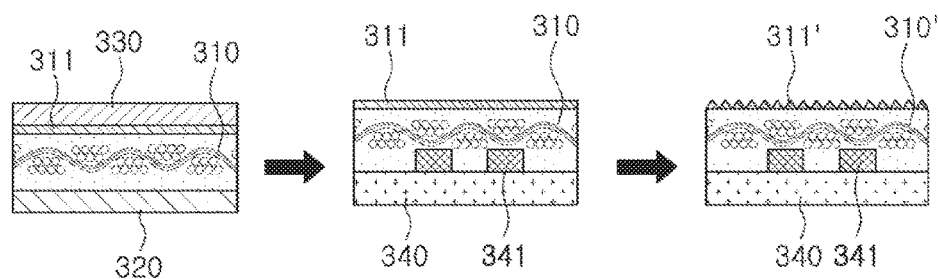

FIGS. 15A and 15B are schematic views illustrating examples of materials that may be used as materials of an encapsulant and/or a passivation layer of a fan-out semiconductor package.

Referring to the drawings, FIG. 15A schematically illustrates an example of a material in a case in which a circuit does not need to be formed, for example, a GC material, and FIG. 15B schematically illustrates an example of a material in a case in which a circuit needs to be formed or a separate layer needs to be laminated, for example, a GCP material. The GC material may include an insulating layer 210 including an insulating resin, a core material, a filler, and the like, a cover film 220 covering one surface of the insulating layer 210 and formed of oriented polypropylene (OPP), or the like, and a base film 230 covering the other surface of the insulating layer 210 and formed of polyethylene phthalate (PET), or the like. The insulating layer 210 may be laminated in a non-hardened state on a base substrate 240 having patterns 241 and be then hardened to be thus used as a hardened insulating layer 210'. The GCP material may include an insulating layer 310 including an insulating resin, a core material, a filler, and the like, a cover film 320 covering one surface of the insulating layer 310 and formed of OPP, or the like, a primer layer 311 covering the other surface of the insulating layer 310 and formed of a metal thin film, or the like, and a base film 330 covering one surface of the primer layer 311 and formed of PET, or the like. The insulating layer 310 may be laminated in a non-hardened state on a base substrate 340 having patterns 341 and be then hardened to be thus used as a hardened insulating layer 310'. The primer layer 311 may be used in a state 311' in which it is processed by a desmear process for the purpose of the case in which the circuit needs to be formed or the separate layer needs to be laminated. The GC material may be used to form the first encapsulant 130, and the GCP material may be used to form the first passivation layer 150. However, the GC material and the GCP material are not limited thereto. That is, the GCP may be used to form the first encapsulant 130 in order to achieve an additional object.

As set forth above, according to the exemplary embodiment in the present disclosure, a fan-out semiconductor package capable of having excellent rigidity, being thinned, and being manufactured in a simplified process may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a semiconductor chip having an active surface having connection pads disposed thereon and an inactive surface opposing the active surface;
a first encapsulant being in direct contact with the inactive surface of the semiconductor chip;
a second encapsulant disposed on the first encapsulant; and
a first connection member disposed on the active surface of the semiconductor chip,
wherein the first connection member includes a redistribution layers electrically connected to the connection pads of the semiconductor chip,
the first encapsulant includes an insulating resin, a glass fiber, and an inorganic filler, and
the second encapsulant includes an insulating resin and an inorganic filler.

2. The semiconductor package of claim 1, further comprising a first primer layer disposed between the first encapsulant and the second encapsulant and being in contact with the first encapsulant and the second encapsulant.

3. The semiconductor package of claim 1, further comprising:
a passivation layer disposed on the first connection member and having openings exposing at least portions of the redistribution layer of the first connection member;
an under-bump metal layer formed in the openings and connected to the exposed redistribution layer of the first connection member; and
wherein the passivation layer includes an insulating resin, a glass fiber, and an inorganic filler, and
the first connection member is disposed between the passivation layer and the semiconductor chip.

4. The semiconductor package of claim 3, further comprising a second primer layer disposed between the passivation layer and the under-bump metal layer and being in contact with the passivation layer and the under-bump metal layer.

5. The semiconductor package of claim 1, further comprising:
an insulating member having a through-hole,
wherein the semiconductor chip is disposed in the through-hole of the insulating member.

6. The semiconductor package of claim 5, wherein the glass fiber of the first encapsulant is disposed on the insulating member and the inactive surface of the semiconductor chip, and
the inorganic filler of the first encapsulant is disposed on the insulating layer and the inactive surface of the semiconductor chip and in a space between a wall surface of the through-hole and a side surface of the semiconductor chip.

7. The semiconductor package of claim 5, further comprising:
a passivation layer disposed on the first connection member and having an opening exposing at least a portion of the redistribution layer of the first connection member; and
an under-bump metal layer formed in the opening and connected to the redistribution layer of the first connection member having been exposed,
wherein the passivation layer includes an insulating resin, a glass fiber, and an inorganic filler, and the first connection member is disposed between the passivation layer and the semiconductor chip.

8. The semiconductor package of claim 1, further comprising a second connection member having a through-hole,
wherein the semiconductor chip is disposed in the through-hole of the second connection member, and
wherein the second connection member includes a first insulating layer, a first redistribution layer in contact with the first connection member and embedded in the first insulating layer, and a second redistribution layer disposed on the other surface of the first insulating layer opposing one surface of the first insulating layer in which the first redistribution layer is embedded, and
the first and second redistribution layers are electrically connected to the connection pads.

9. The semiconductor package of claim 8, wherein the second connection member further includes a second insulating layer disposed on the first insulating layer and covering the second redistribution layer and a third redistribution layer disposed on the second insulating layer, and
the first to third redistribution layers are electrically connected to the connection pads.

10. The semiconductor package of claim 9, further comprising:
a passivation layer disposed on the first connection member and having an opening exposing at least a portion of the redistribution layer of the first connection member; and
an under-bump metal layer formed in the opening and connected to the redistribution layer of the first connection member having been exposed,
wherein the passivation layer includes an insulating resin, a glass fiber, and an inorganic filler, and
the first connection member is disposed between the passivation layer and the semiconductor chip.

11. The semiconductor package of claim 9, further comprising:
a backside redistribution layer disposed on the second encapsulant; and
a backside via passing through the first encapsulant and the second encapsulant and electrically connecting the backside redistribution layer and the third redistribution layer to each other.

12. The semiconductor package of claim 11, further comprising:
a first passivation layer disposed on the first connection member and having a first opening exposing at least a portion of the redistribution layer of the first connection member; and
a second passivation layer disposed on the second encapsulant and having a second opening exposing at least a portion of the backside redistribution layer,
wherein the first connection member is disposed between the first passivation layer and the semiconductor chip, and
the second encapsulant is disposed between the second passivation layer and the first encapsulant.

13. The semiconductor package of claim 12, wherein the first passivation layer includes an insulating resin, a glass fiber, and an inorganic filler.

14. The semiconductor package of claim 12, wherein the first passivation layer and the second passivation layer respectively include an insulating resin and an inorganic filler, and a percentage by weight of the inorganic filler included in the first passivation layer is greater than a percentage by weight of the inorganic filler included in the second passivation layer.

15. The semiconductor package of claim 9, wherein a distance between the redistribution layer of the first connection member and the first redistribution layer of second connection member having the through-hole in which the semiconductor chip is disposed, is greater than that between the redistribution layer of the first connection member and the connection pad of the semiconductor chip.

16. The semiconductor package of claim 1, further comprising:
a second connection member having a through-hole,
wherein the semiconductor chip is disposed in the through-hole of the second connection member,
the second connection member includes a first insulating layer, as well as a first redistribution layer and a second redistribution layer disposed on opposing surfaces of the first insulating layer, respectively, and
the first redistribution layer and the second redistribution layer are electrically connected to the connection pad of the semiconductor chip.

17. The semiconductor package of claim 16, wherein the second connection member further includes a second insulating layer disposed on the first insulating layer and covering the first redistribution layer, and a third redistribution layer disposed on the second insulating layer, and
the third redistribution layer is electrically connected to the connection pads.

18. The semiconductor package of claim 17, wherein the second connection member further includes a third insulating layer disposed on the first insulating layer and covering the second redistribution layer and a fourth redistribution layer disposed on the third insulating layer, and
the fourth redistribution layer is electrically connected to the connection pads.

19. The semiconductor package of claim 18, further comprising:
a passivation layer disposed on the first connection member and having an opening exposing at least a portion of the redistribution layer of the first connection member; and
an under-bump metal layer formed in the opening and connected to the redistribution layer of the first connection member having been exposed,
wherein the passivation layer includes an insulating resin, a glass fiber, and an inorganic filler, and
the first connection member is disposed between the passivation layer and the semiconductor chip.

20. The semiconductor package of claim 18, further comprising:
a backside redistribution layer disposed on the second encapsulant; and
a backside via passing through the first encapsulant and the second encapsulant and electrically connecting the backside redistribution layer and the fourth redistribution layer to each other.

21. The semiconductor package of claim 20, further comprising:
a first passivation layer disposed on the first connection member and having a first opening exposing at least a portion of the redistribution layer of the first connection member; and
a second passivation layer disposed on the second encapsulant and having a second opening exposing at least a portion of the backside redistribution layer, wherein the first connection member is disposed between the first passivation layer and the semiconductor chip, and the second encapsulant is disposed between the second passivation layer and the first encapsulant.

22. The semiconductor package of claim 21, wherein the first passivation layer includes an insulating resin, a glass fiber, and an inorganic filler.

23. The semiconductor package of claim 18, wherein the first insulating layer has a thickness greater than that of the second insulating layer.

24. The semiconductor package of claim 1, wherein the first encapsulant has an elastic modulus greater than that of the second encapsulant.

25. A semiconductor package comprising:
a semiconductor chip having an active surface having connection pads disposed thereon, an inactive surface opposing the active surface, and side surfaces connecting the active surface and the inactive surface;
an encapsulant encapsulating at least portions of the inactive surface and the side surfaces of the semiconductor chip;
a first connection member having a major surface, on which the at least portions of encapsulant encapsulating the side surfaces of the semiconductor chip and the semiconductor chip are disposed, and side surfaces spaced-apart from the encapsulant;
a first passivation layer disposed on the first connection member,
wherein the first connection member includes a redistribution layers electrically connected to the connection pads of the semiconductor chip, and
the first passivation layer includes an insulating resin, a glass fiber, and an inorganic filler.

26. The semiconductor package of claim 25, wherein the first passivation layer has openings exposing at least portions of the redistribution layer of the first connection member, and
an under-bump metal layer connected to the exposed redistribution layer of the first connection member is formed in the openings.

27. The semiconductor package of claim 26, further comprising a primer layer disposed between the first passivation layer and the under-bump metal layer and being in contact with the under-bump metal layer and the first passivation layer.

28. The semiconductor package of claim 25, further comprising:
an insulating member having a through-hole,
wherein the semiconductor chip is disposed in the through-hole of the insulating member.

29. The semiconductor package of claim 25, further comprising a second connection member having a through-hole,
wherein the semiconductor chip is disposed in the through-hole of the second connection member, and
wherein the second connection member includes a first insulating layer, a first redistribution layer in contact with the first connection member and embedded in the first insulating layer, and a second redistribution layer disposed on the other surface of the first insulating layer opposing one surface of the first insulating layer in which the first redistribution layer is embedded, a second insulating layer disposed on the first insulating layer and covering the second redistribution layer and a third redistribution layer disposed on the second insulating layer, and
the first to third redistribution layers are electrically connected to the connection pads.

30. The semiconductor package of claim 29, further comprising:
a backside redistribution layer disposed on the encapsulant;
a backside via passing through the encapsulant and electrically connecting the backside redistribution layer and the third redistribution layer to each other; and
a second passivation layer disposed on the encapsulant and having a second opening exposing at least a portion of the backside redistribution layer.

31. The semiconductor package of claim 25, further comprising:
a second connection member having a through-hole,
wherein the semiconductor chip is disposed in the through-hole of the second connection member, and
the second connection member includes a first insulating layer, a first redistribution layer and a second redistribution layer disposed on opposing surfaces of the first insulating layer, a second insulating layer disposed on the first insulating layer and covering the first redistribution layer, a third redistribution layer disposed on the second insulating layer, a third insulating layer disposed on the first insulating layer and covering the second redistribution layer, and a fourth redistribution layer disposed on the third insulating layer, the first redistribution layer, the second redistribution layer, the third redistribution layer, and the fourth redistribution layer being electrically connected to the connection pad of the semiconductor chip.

32. The semiconductor package of claim 31, further comprising:
a backside redistribution layer disposed on the encapsulant;
a backside via passing through the encapsulant and electrically connecting the backside redistribution layer and the fourth redistribution layer to each other; and
a second passivation layer disposed on the encapsulant and having a second opening exposing at least a portion of the backside redistribution layer.

33. The semiconductor package of claim 26, wherein at least one of the openings of the first passivation layer is disposed on a fan-out region.

34. The semiconductor package of claim 26, further comprising connection terminals disposed on the under-bump metal layer,
wherein portions of the under-bump metal layer are disposed between the connection terminals and the first passivation layer.

35. The semiconductor package of claim 3, wherein at least one of the openings of the passivation layer is disposed on a fan-out region.

36. The semiconductor package of claim 3, further comprising connection terminals disposed on the under-bump metal layer,
wherein portions of the under-bump metal layer are disposed between the connection terminals and the passivation layer.

* * * * *